(12) United States Patent
Kapoor et al.

(10) Patent No.: US 10,665,427 B2
(45) Date of Patent: May 26, 2020

(54) RF GENERATOR FOR GENERATING A MODULATED FREQUENCY OR AN INTER-MODULATED FREQUENCY

(71) Applicant: Lam Research Corporation, Fremont, CA (US)

(72) Inventors: Sunil Kapoor, Vancouver, WA (US); Thomas Frederick, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/416,104

(22) Filed: May 17, 2019

(65) Prior Publication Data

US 2020/0027701 A1 Jan. 23, 2020

Related U.S. Application Data

(63) Continuation of application No. 16/040,433, filed on Jul. 19, 2018, now Pat. No. 10,304,663.

(51) Int. Cl.
*H01J 37/32* (2006.01)
*H01L 21/687* (2006.01)
*H01L 21/67* (2006.01)
*H01L 21/683* (2006.01)

(52) U.S. Cl.
CPC .... *H01J 37/32183* (2013.01); *H01J 37/3299* (2013.01); *H01L 21/67201* (2013.01); *H01L 21/68764* (2013.01); *H01L 21/68771* (2013.01); *H01J 37/321* (2013.01); *H01J 37/32091* (2013.01); *H01J 37/32715* (2013.01); *H01J 2237/3321* (2013.01); *H01L 21/683* (2013.01)

(58) Field of Classification Search
CPC ............ H01J 37/32183; H01J 37/3299; H01J 37/321; H01J 2237/3321; H01J 37/32091; H01J 37/32715; H01L 21/683
USPC ..................................................... 315/111.21
See application file for complete search history.

(56) References Cited

U.S. PATENT DOCUMENTS

| 6,358,573 | B1 | 3/2002 | Raoux et al. | |
|---|---|---|---|---|
| 2006/0241410 | A1* | 10/2006 | Fang | A61B 5/05 600/430 |
| 2011/0188608 | A1* | 8/2011 | Oba | H03D 1/00 375/316 |

(Continued)

OTHER PUBLICATIONS

ISR PCTUS2019040734, dated Oct. 25, 2019, 8 pages.

*Primary Examiner* — Daniel D Chang
(74) *Attorney, Agent, or Firm* — Penilla IP, APC

(57) ABSTRACT

A high frequency radio frequency (RF) generator that generates a high frequency RF signal is described. There is no need for another low frequency RF generator that generates a low frequency RF signal. A low frequency RF signal is pre-amplified within the high frequency RF generator to output a pre-amplified low frequency RF signal. Similarly, a high frequency RF signal is pre-amplified within the high frequency RF generator to output a pre-amplified high frequency RF signal. The high frequency RF generator combines the pre-amplified low frequency RF with the pre-amplified high frequency RF signal to provide a combined RF signal. The combined RF signal is amplified within the high frequency RF generator to supply an amplified signal to a match. There is also no need for another match for the low frequency RF generator.

18 Claims, 10 Drawing Sheets

(56) References Cited

U.S. PATENT DOCUMENTS

2016/0295677 A1  10/2016  Leeser

* cited by examiner

RF GENERATOR FOR GENERATING A MODULATED FREQUENCY OR AN INTER-MODULATED FREQUENCY

CLAIM OF PRIORITY

The present patent application is a continuation of and claims the benefit of and priority, under 35 U.S.C. § 120, to U.S. patent application having application Ser. No. 16/040,433, filed on Jul. 19, 2018, and titled "RF GENERATOR FOR GENERATING A MODULATED FREQUENCY OR AN INTER-MODULATED FREQUENCY", which is incorporated by reference herein in its entirety.

FIELD

The present embodiments relate to a radio frequency (RF) generator for generating a modulated frequency or an inter-modulated frequency.

BACKGROUND

Generally, process reactors are used to process operations upon wafers, e.g., silicon wafers. These wafers are typically processed numerous times in various reactors in order to form integrated circuits thereon. Some of these process operations involve, for instance, depositing materials over select surfaces or layers of a wafer.

One such reactor is a plasma enhanced chemical vapor deposition (PECVD) reactor. For example, the PECVD reactor can be used to deposit insulation films such as silicon oxide (SiO), silicon nitride (SiN), silicon carbide (SiC), silicon oxycarbide (SiOC), and others. Depending on a type of film being deposited, specific reaction gases are brought into the PECVD reactor while radio frequency (RF) power is supplied to produce plasma that enables the deposition. The RF power is generated by multiple RF generators and provided via corresponding multiple matchboxes to multiple electrodes of multiple PECVD reactors.

It is in this context that embodiments described in the present disclosure arise.

SUMMARY

Embodiments of the disclosure include systems and methods for providing a radio frequency (RF) generator for generating a modulated frequency or an inter-modulated frequency. It should be appreciated that the present embodiments can be implemented in numerous ways, e.g., a process, an apparatus, a system, a device, or a method on a computer-readable medium. Several embodiments are described below.

In a plasma tool, such as a deposition tool or an etch tool, two frequencies are used. The two frequencies include a lower frequency and a higher frequency. The use of the two frequencies helps in controlling plasma density and plasma energy separately. For example, the lower frequency primarily controls energy of multiple radicals and hence stress of a film to be deposited on a substrate. The higher frequency primarily controls a density of plasma and hence a deposition rate of the film on the substrate.

The plasma tool includes a match and a low frequency generator operating at a first frequency. The plasma tool further includes another match and a high frequency generator operating at a second frequency. Outputs from both the matches are fed to a combiner that is coupled to a station. High amounts of power at both the frequencies are combined at the station. However, in the plasma tool, cost and real-estate usage is high. For example, there are the two low and high frequency generators and the two matches. Moreover, a reliability of the plasma tool decreases and complexity of the plasma tool increases. With an increase in a number of the generators and a corresponding increase in a number of the matches, there is a decrease in reliability of the plasma tool. As the number of the generators and the number of the matches increase, there is an increase in a number of components used within the generators and an increase in a number of components used within the matches and therefore, a decrease in reliability of the plasma tool. Also, a number of connections associated with the components of the two matches and a number of connections associated with the components of the two generators increase to increase the complexity of the plasma tool and decrease the reliability of the plasma tool.

In some embodiments, an RF generator is provided in which both the frequencies are combined. The RF generator has a combiner that combines the frequencies. The combined frequencies are then provided to a power amplifier for amplifying the combined frequencies together to output an amplified signal. The amplified signal is provided to a match, which is coupled via a distributor to multiple stations.

In some embodiments, a high frequency RF generator is described. The high frequency RF generator includes a low frequency oscillator configured to generate a low frequency RF signal, a high frequency oscillator configured to generate a high frequency RF signal, and a high frequency pre-amplifier coupled to an output terminal of the high frequency oscillator to receive the high frequency RF signal. The high frequency pre-amplifier amplifies the high frequency RF signal to produce an amplified high frequency RF signal. The high frequency RF generator further includes a low frequency pre-amplifier coupled to an output terminal of the low frequency oscillator to receive the low frequency RF signal. The low frequency pre-amplifier amplifies the low frequency RF signal to produce an amplified low frequency RF signal. The high frequency RF generator also includes a combiner coupled to an output terminal of the high frequency pre-amplifier to receive the amplified high frequency RF signal from the high frequency pre-amplifier. The combiner is further coupled to an output terminal of the low frequency pre-amplifier to receive the amplified low frequency RF signal from the low frequency pre-amplifier. The combiner multiplies the amplified low frequency RF signal with the amplified high frequency RF signal to output a combined RF signal. The high frequency RF generator includes an output amplifier coupled to an output terminal of the combiner. The output amplifier amplifies the combined RF signal to output an amplified signal to provide the amplified signal to an impedance matching circuit.

In various embodiments, another high frequency RF generator is described. The other high frequency RF generator is the same as that described above except that instead of the combiner that multiplies the amplified low frequency RF signal with the amplified high frequency RF signal, a combiner of the other high frequency RF generator adds the amplified low frequency RF signal with the amplified high frequency RF signal to output a combined RF signal.

In several embodiments, a plasma system is described. The plasma system includes a high frequency RF generator. The high frequency RF generator includes the low frequency oscillator, the high frequency oscillator, the high frequency pre-amplifier, the low frequency pre-amplifier, and a combiner. The combiner combines the amplified low frequency RF signal with the amplified high frequency RF signal to output a combined RF signal. The high frequency RF generator further includes the output amplifier coupled to an output terminal of the combiner. The output amplifier amplifies the combined RF signal to output an amplified signal. The plasma system further includes a match coupled to an output terminal of high frequency RF generator. The match receives the amplified signal to output a modified RF signal. The plasma system also includes a distributor coupled to an output terminal of the match. The distributor receives the modified RF signal to output a plurality of distributed RF signals.

Some advantages of the RF generator, described herein, in which both the frequencies are combined include a reduction in the number of the generators from two to one. The two generators generating the two frequencies are reduced to the RF generator in which both the frequencies are combined and amplified after being combined. Multiple components of the RF generator are packaged in a generator box and so, real-estate is reduced. For example, the RF generator, described herein uses approximately 50% less components than a total number of the components of the two generators. Moreover, there is a reduction in the number of matches from two to one. The reduction in the number of matches reduces a number of the components of the matches. For example, the match coupled to the RF generator, described herein, uses approximately 50% less components than a total number of the components of the two matches of the plasma tool. As such, there is a reduction in the cost, the real-estate usage, and the complexity, and there is an increase in the reliability. For example, the approximately 50% reductions result in about a 100% increase in reliability when the match and the RF generator are used instead of the two matches and the two generators.

Additional advantages of the RF generator in which both the frequencies are combined include a reduction in a number of power amplifiers used. In the plasma tool having the two generators, there are two power amplifiers used. Each power amplifier amplifies a corresponding frequency. The amplified frequencies are then fed into the corresponding matches and outputs from the matches are combined by the combiner of the plasma tool. In the herein described RF generator, the combiner is used before the power amplifier and therefore, the combiner is smaller in size to that used in the plasma tool. The combiner consumes less power than that consumed by the combiner that is coupled to outputs of the two matches of the plasma tool.

Further advantages include a reduction in metrology that is used for measurement of factors, such as power, current, voltage, etc. associated with the RF generator and associated the match compared to metrology used for the two generators and the two matches. There are a less number of points and paths when the RF generator along which measurements can be made and the match are used compared to that when the two generators and the two matches are used. Moreover, costs associated with the metrology reduce when the RF generator and the match are used instead of the two generators and the two matches.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe a radio frequency (RF) generator for generating a modulated frequency or an inter-modulated frequency. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more plasma chambers or "reactors" that house one or more wafers and are suitable for wafer processing. Sometimes, a reactor or a plasma chamber is referred to herein as a station. Each of the one or more plasma chambers houses the one or more wafers for processing, such as deposition or etching or cleaning or sputtering of the one or more wafers. Each of the one or more plasma chambers maintains a wafer in a defined position or positions with or without motion, e.g. rotation, vibration, or other agitation, etc. The wafer undergoing processing is transferred from one of the plasma chambers to another when needed. For example, a film deposition occurs at one of the plasma chambers or any fraction of the film is deposited at any number of the plasma chambers. While in process, each wafer is held in place by a pedestal, e.g., a wafer chuck, etc., and/or other wafer holding apparatus, of one of the plasma chambers.

Figure 1:
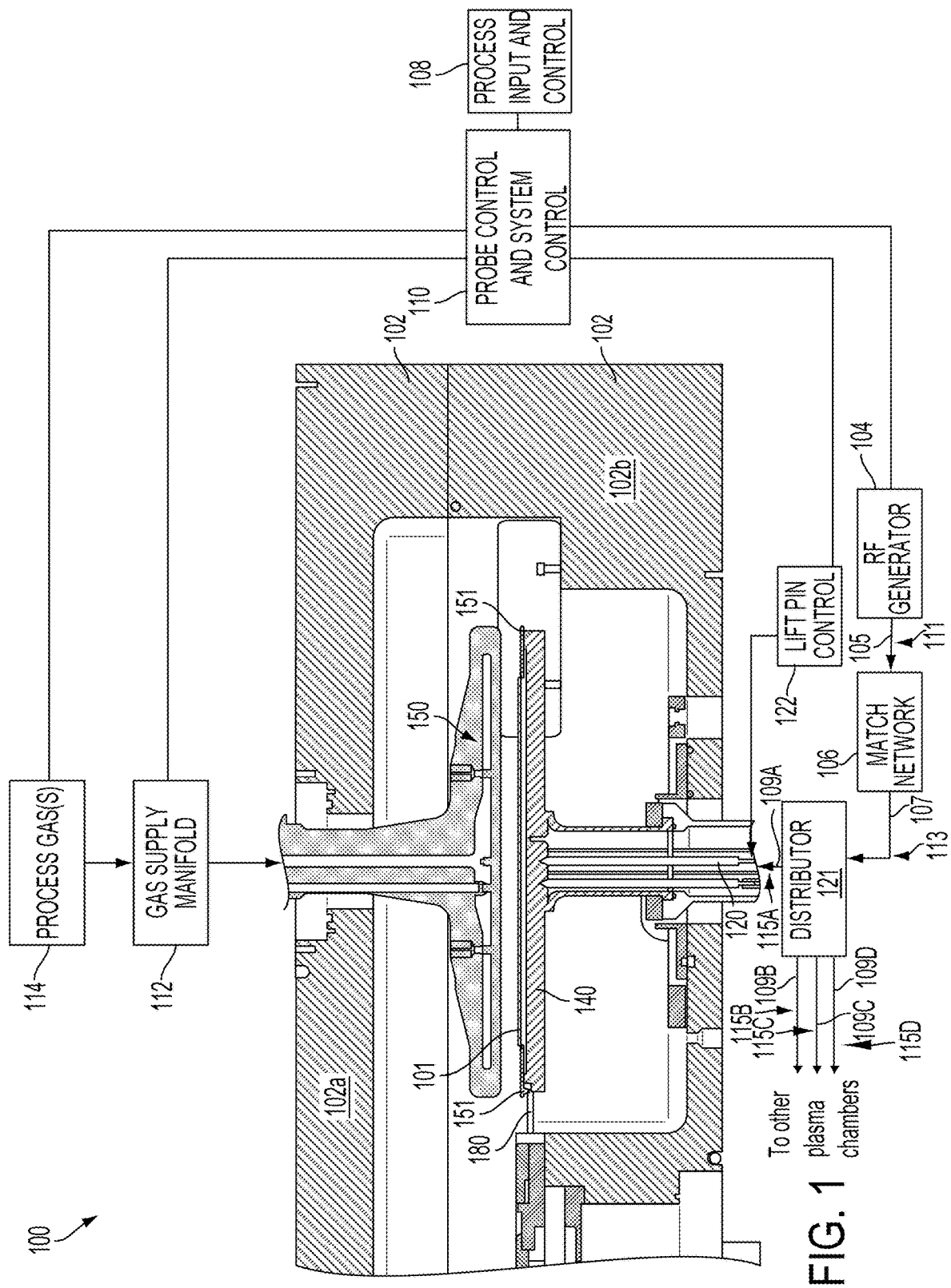
FIG. 1 illustrates a substrate processing system that is used to process a wafer.

FIG. 1 illustrates a substrate processing system 100, which is an example of the PECVD system used to process a wafer 101. The wafer 101 is a semiconductor wafer on which integrated circuits are fabricated. The integrated circuits are implemented within an electronic device, such as a cell phone, a television, a tablet, a sensor, and Internet of Things (IoT) device, etc. The substrate processing system 100 includes a plasma chamber 102 having a lower chamber portion 102b and an upper chamber portion 102a. An example of the plasma chamber 102 includes a PECVD plasma chamber. A center column supports a pedestal 140, which includes a lower electrode of the pedestal 140. The wafer 101 is placed on the pedestal 140 for processing the wafer 101. Examples of processing the wafer 101 include depositing one or more materials, such as oxides or metals, on the wafer 101, etching the wafer 101, cleaning the wafer 101, and sputtering the wafer 101.

The lower electrode is made from a metal, such as aluminum, or an alloy of aluminum. The lower electrode of the pedestal 140 is electrically coupled to a distributor 121, which is further coupled to an output terminal of a match network 106. An RF connector 109A electrically couples the lower electrode of the pedestal 140 to the distributor 121. An example of an RF connector, as used herein, includes a conductor, such as a wire or a cable.

The match network 106 has a housing, such as metal housing that encloses components of the match network 106. Examples of the components of the match network 106 include resistors, inductors, and capacitors. The components located inside the housing of the match network 106 are accessible via a door of the housing or via a side of the housing. For example, a user opens the door of the housing of the match network 106 to gain access to one or more of the components of the match network 106. As another example, the user removes a side wall or a top wall of the housing of the match network 106 to access one or more of the components of the match network 106. In some embodiments, the terms match and matchbox and match network and impedance matching network and impedance matching circuit are used interchangeably herein.

An example of the distributor 121 is a distribution circuit having an input RF connector (not shown) and multiple output RF connectors (not shown). The input RF connector of the distributor 121 is connected via a connection point to the output RF connectors of the distributor 121. An RF transmission line 107 couples the input RF connector of the distributor 121 to the output terminal of the match network 106. Moreover, the output RF connectors of the distributor 121 are coupled to the RF connectors 109A, 109B, 109C, and 109D. For example, a first one of the output RF connectors of the distributor 121 is connected to the RF connector 109A, a second one of the output RF connectors of the distributor 121 is connected to the RF connector 109B, a third one of the output RF connectors of the distributor 121 is connected to the RF connector 109C, and a fourth one of the output RF connectors of the distributor 121 is connected to the RF connector 109D.

Each of the multiple RF connectors 109B, 109C, and 109D is coupled to a corresponding plasma chamber other than the plasma chamber 102. The corresponding plasma chamber has the same structure as the plasma chamber 102. The plasma chamber 102 is sometimes referred to herein as a station 1. The corresponding plasma chambers, other than the plasma chamber 102, are sometimes referred to herein as a station 2, a station 3, and a station 4. An input terminal of the match network 106 is coupled to an RF generator 104 via an RF cable 105.

A match network, as described herein, is a network of one or more components, such as one or more resistors, or one or more capacitors, or one or more inductors, or a combination thereof, that match an impedance of a load coupled to one or more output terminals of the match network with an impedance of a source coupled to one or more input terminals of the match network. An example of a load coupled to the output terminal of the match network 106 includes the distributor 121 and the stations 1 through 4. An example of a source coupled to the input terminal of the match network 106 includes the RF generator 104 and the RF cable 105. Two or more of the components are coupled to each other in a parallel or serial manner. Examples of the RF generator 104 include a 13.56 megahertz (MHz) RF generator, a 27 MHz RF generator, and a 60 MHz RF generator. The RF generator 104 is a high frequency RF generator.

The RF generator 104 is coupled to a probe control and system control 110, e.g., a controller, a host computer system, etc., via a transfer cable and is controlled by the probe control and system control 110. Examples of a transfer cable, as used herein, include a cable that transfers data in a serial manner, or in a parallel manner, or by applying a universal serial bus (USB) protocol. Examples of a controller include a combination of a processor and a memory device. The processor of the controller is coupled to the memory device of the controller. A processor, as used herein, is an application specific integrated circuit (ASIC), a programmable logic device (PLD), a central processing unit (CPU), or a microprocessor, etc. Examples of a memory device, as used herein, include a read-only memory (ROM), a random access memory (RAM), a redundant array of storage disks, a hard disk, a Flash memory, etc. Examples of the host computer system include a laptop computer, a desktop computer, a tablet, and a smartphone.

The probe control and system control 110 operates the substrate processing system 100 by executing a process input and control 108. The process input and control 108 includes one or more process recipes, such as power levels, frequency levels, timing parameters, process gases, mechanical movement of the wafer 101, a gap between a showerhead 150 and the pedestal 140, etc., so as to deposit or form films on a top surface of the wafer 101. The process input and control 108 is stored within the memory device of the probe control and system control 110. The showerhead 150 includes an upper electrode, which is also made from the metal. The upper electrode is coupled to a ground potential.

The center column is also shown to include lift pins 120, which are controlled by a lift pin control 122. The lift pins 120 are used to raise the wafer 101 from the pedestal 140 to allow an end-effector to pick the wafer 101 and to lower the wafer 101 after being placed by the end-effector. The substrate processing system 100 further includes a gas supply manifold 112 that is connected to process gases 114, e.g., gas chemistry supplies from a facility, etc. Depending on the processing being performed, the probe control and system control 110 controls a delivery of the process gases 114 via the gas supply manifold 112. Examples of the process gases 114 include an oxygen-containing gas, such as $O_2$. Other examples of the process gases 114 include a fluorine-containing gas, e.g., tetrafluoromethane ($CF_4$), sulfur hexafluoride ($SF_6$), hexafluoroethane ($C_2F_6$), etc. The process gases 114 are then flown into the showerhead 150 and distributed in a space volume, e.g., the gap, etc., defined between the showerhead 150 that faces that wafer 101 and the pedestal 140.

Further, in some embodiments, the process gases 114 are premixed or not. Appropriate valving and mass flow control mechanisms is employed to ensure that the specified ones of the process gases 114 are delivered during deposition and plasma treatment phases of the process. The process gases 114 exit the plasma chamber 102 via an outlet. A vacuum pump, e.g., a one or two stage mechanical dry pump, a turbomolecular pump, etc., draws the process gases 114 out from the plasma chamber 102. Also, a suitably low pressure maintained within the plasma chamber 102 by a close loop controlled flow restriction device, such as a throttle valve or a pendulum valve, between a bottom wall of the plasma chamber 102 and the vacuum pump.

Also shown is a carrier ring 151 that encircles an outer region of the pedestal 140. The carrier ring 151 sits over a carrier ring support region that is a step down from a wafer support region around and proximate to a center of the pedestal 140. The carrier ring 151 includes an outer edge side of its disk structure, e.g., outer radius, etc., and a wafer edge side of its disk structure, e.g., inner radius, etc., that is closest to where the wafer 101 sits. The wafer edge side of the carrier ring 151 includes a plurality of contact support structures which lift the wafer 101 when the carrier ring 151 is lifted by multiple spider forks 180. The carrier ring 151 is therefore lifted along with the wafer 101 and is rotated to another station, such as one of the other plasma chambers, in a multi-station system.

Upon receiving the power levels and the frequency levels from the probe control and system control 110 via the transfer cable, the RF generator 104 generates an RF signal 111 having the power levels and the frequency levels and supplies the RF signal 111 via the RF cable 105 to the input terminal of the match network 106. The match network 106 matches an impedance of the load coupled to the output terminal of the match network 106 with an impedance of the source coupled to the input terminal of the match network 106 to output a modified RF signal 113 from the RF signal 111.

The modified RF signal 113 is supplied from the output terminal of the match network 106 via the RF transmission line 107 and an input terminal of the distributor 121 to the input RF connector of the distributor 121. The input terminal of the distributor 121 is coupled to the input RF connector of the distributor 121. The distributor 121 distributes RF power of the modified RF signal 113 to output multiple RF signals 115A, 115B, 115C, and 115D via the multiple output RF connectors of the distributor 121. The RF signal 115A is supplied via the first output RF connector of the distributor 121 and the RF connector 109A to the lower electrode of the plasma chamber 102. Similarly, the RF signal 115B is supplied via the second output RF connector of the distributor 121 and the RF connector 109B to a lower electrode of the station 2, the RF signal 115C is supplied via the third output RF connector of the distributor 121 and the RF connector 109C to a lower electrode of the station 3, and the RF signal 115C is supplied via the fourth output RF connector of the distributor 121 and the RF connector 109C to a lower electrode of the station 4.

When the process gases 114 are supplied to the gap between the showerhead 150 and the pedestal 140 in addition to supplying the RF signal 115A to the lower electrode of the plasma chamber 102, plasma is stricken or maintained within the plasma chamber 102 to process the wafer 101. Similarly, by supplying process gases to a gap between a showerhead and a pedestal of the station 2 in addition to supplying the RF signal 115B to the lower electrode of the station 2, plasma is stricken or maintained within the station 2 to process the wafer 101 or another wafer. Also, in a similar manner, when process gases are supplied to a gap between a showerhead and a pedestal of the station 3 in addition to supplying the RF signal 115C to the lower electrode of the station 3, plasma is stricken or maintained within the station 3 to process the wafer 101 or another wafer. When process gases are supplied to a gap between a showerhead and a pedestal of the station 4 in addition to supplying the RF signal 115D to the lower electrode of the station 4, plasma is stricken or maintained within the station 3 to process the wafer 101 or another wafer.

In various embodiments, upper electrodes of showerheads of the stations 2 through 4 are coupled to the ground potential.

In one embodiment, instead of the lower electrodes of the stations 1 through 4 being electrically coupled to the RF generator 104 via the match network 106, the upper electrodes of the showerheads of the stations 1 through 4 are coupled to the RF generator 104 via the match network 106 for receiving power from the RF generator 104 and the lower electrodes within the pedestals of the stations 1 through 4 are grounded.

In some embodiments, only the RF generator 104 is used within the substrate processing system 100. There is no need for another low frequency RF generator that generates an RF signal having a low frequency, as described herein. Moreover, in these embodiments, only the match network 106 is used. There is no need for another match network that receives the RF signal from the low frequency RF generator.

Figure 2:
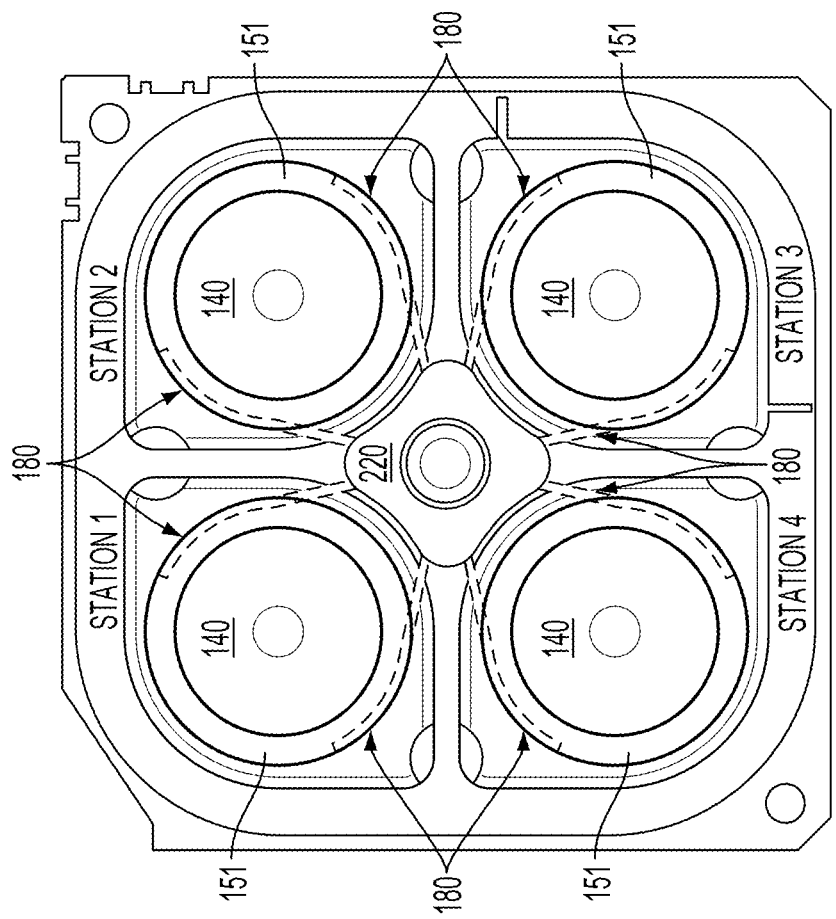
FIG. 2 illustrates a top view of a multi-station processing tool, where four processing stations are provided.

FIG. 2 illustrates a top view of a multi-station processing tool, where four processing stations, which are the station 1, the station 2, the station 3, and the station 4, are provided. The four stations are accessed by the spider forks 180. Each of the four stations is isolated from another one of the four stations by an isolation wall or another mechanism. In one embodiment, there is no such isolation wall or the other mechanism to isolate one station from another. Each spider fork 180 includes a first and second arm, each of which is positioned around a portion of each side of the pedestal 140. In this view, the spider forks 180 are drawn in dash-lines, to convey that they are below the carrier ring 151. The spider forks 180, using an engagement and rotation mechanism 220, raise up and lift the carrier rings 151 from a lower surface of the carrier rings 151 from the stations 1 through 4 simultaneously, and then rotate between two or more of the stations 1 through 4 before lowering the carrier rings 151. During the rotation, at least one of the carrier rings 151 supports the wafer 101 to a next location so that further plasma processing, treatment and/or film deposition takes place on the wafer 101.

Figure 3:
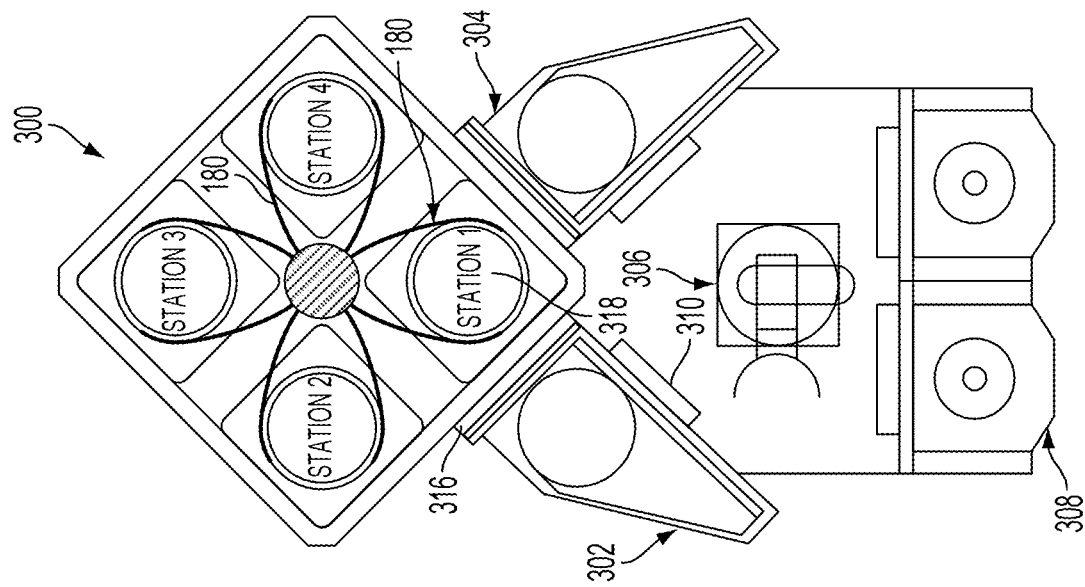
FIG. 3 shows a schematic view of an embodiment of a multi-station processing tool with an inbound load lock and an outbound load lock.

FIG. 3 shows a schematic view of an embodiment of a multi-station processing tool 300 with an inbound load lock 302 and an outbound load lock 304. A robot 306, at atmospheric pressure, moves a substrate, e.g., the wafer 101, etc., from a cassette loaded through a pod 308 into the inbound load lock 302 via an atmospheric port 310. The inbound load lock 302 is coupled to a vacuum source (not shown) so that, when the atmospheric port 310 is closed, the inbound load lock 302 is pumped down. The inbound load lock 302 also includes a chamber transport port 316 interfaced with one of the stations 1 through 4. Thus, when the chamber transport 316 is open, another robot (not shown) moves the wafer 101 from the inbound load lock 302 to the pedestal 140 of the station 1 for processing.

In some embodiments, a low pressure environment is maintained in an enclosure that encloses the stations 1 through 4 so that substrates are transferred using the carrier ring 151 among the stations 1 through 4 without experiencing a vacuum break and/or air exposure. Each of the stations 1 through 4 includes a process station substrate holder and process gas delivery line inlets.

The spider forks 180 transfer substrates among the stations 1 through 4. The spider forks 180 rotate and enable transfer of the wafer 101 from one of the stations 1 through 4 to another one of the stations 1 through 4. The transfer occurs by enabling the spider forks 180 to lift the carrier rings 151 from an outer undersurface, which lifts the wafer 101, and rotates the wafer 101 and the carrier ring 151 together to the next station. In one configuration, the spider forks 180 are made from a ceramic material to withstand high levels of heat during processing.

In various embodiments, a number of stations other than four is used. For example, three or two or five plasma processing stations are used to process the wafer 101.

Figure 4:
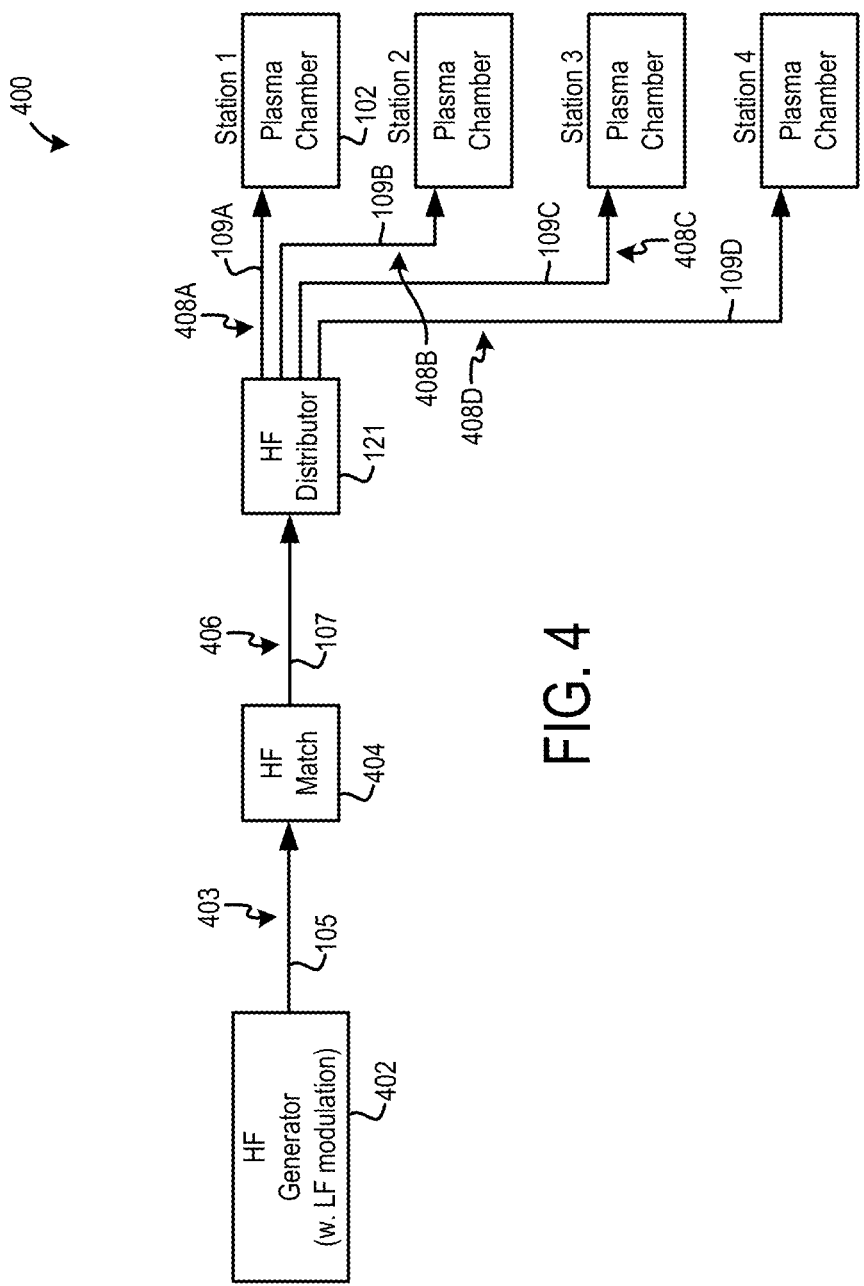
FIG. 4 is a diagram of an embodiment of a system to illustrate use of a radio frequency (RF) generator as a high frequency (HF) generator with low frequency (LF) modulation.

FIG. 4 is a diagram of an embodiment of a system 400 to illustrate use of the RF generator 104 as a high frequency (HF) generator with low frequency (LF) modulation. The system 400 includes an HF generator 402, which is an example of the RF generator 104 of FIG. 1. The system 400 further includes an HF match 404, which is an example of the match network 106 of FIG. 1. The system 400 also includes the distributor 121, which is sometimes referred to herein as an HF distributor. The system 400 includes the plasma chamber 102, the station 2, the station 3, and the station 4. An output terminal of the HF generator 402 is coupled to an input terminal of the HF match 404 via the RF cable 105. Moreover an output terminal of the HF match 404 is coupled to the input terminal of the distributor 121 via the RF transmission line 107.

The HF generator 402 generates a RF signal 403, which is a high frequency RF signal, and supplies the RF signal 403 via the RF cable 105 to the input terminal of the HF match 404. For example, the HF generator 402 performs the LF modulation by multiplying RF power of a low frequency RF signal with RF power of a high frequency RF signal to generate the RF signal 403. The RF signal 403 has an envelope that has a low frequency of the low frequency RF signal. The HF match 404 receives the RF signal 403 and matches an impedance of a load coupled to the output terminal of the HF match 404 with an impedance of a source coupled to the input terminal of the HF match 404 to output a modified RF signal 406. The RF signal 403 is an example of the RF signal 111 of FIG. 1 and the modified RF signal 406 is an example of the modified RF signal 113 of FIG. 1. An example of the load coupled to the output terminal of the HF match 404 includes the RF transmission line 107, the distributor 121, the RF connectors 109A-109D, and the stations 1-4. Moreover an example of the source coupled to the input terminal of the HF match 404 includes the HF generator 402 and the RF cable 105.

The distributor 121 receives the modified RF signal 406 from the output terminal of the HF match 404 via the RF transmission line 107 and distributes RF power of the modified RF signal 406 into a plurality of RF signals 408A, 408B, 408C, and 408D. The RF signal 408A is sent via the RF connector 109A to the lower electrode of the plasma chamber 102 of FIG. 1 and the RF signal 408B is sent via the RF connector 109B to the lower electrode of the station 2. Similarly, the RF signal 408C is sent via the RF connector 109C to the lower electrode of the station 3 and the RF signal 408D is sent via the RF connector 109D to the lower electrode of the station 4.

Figure 5A:
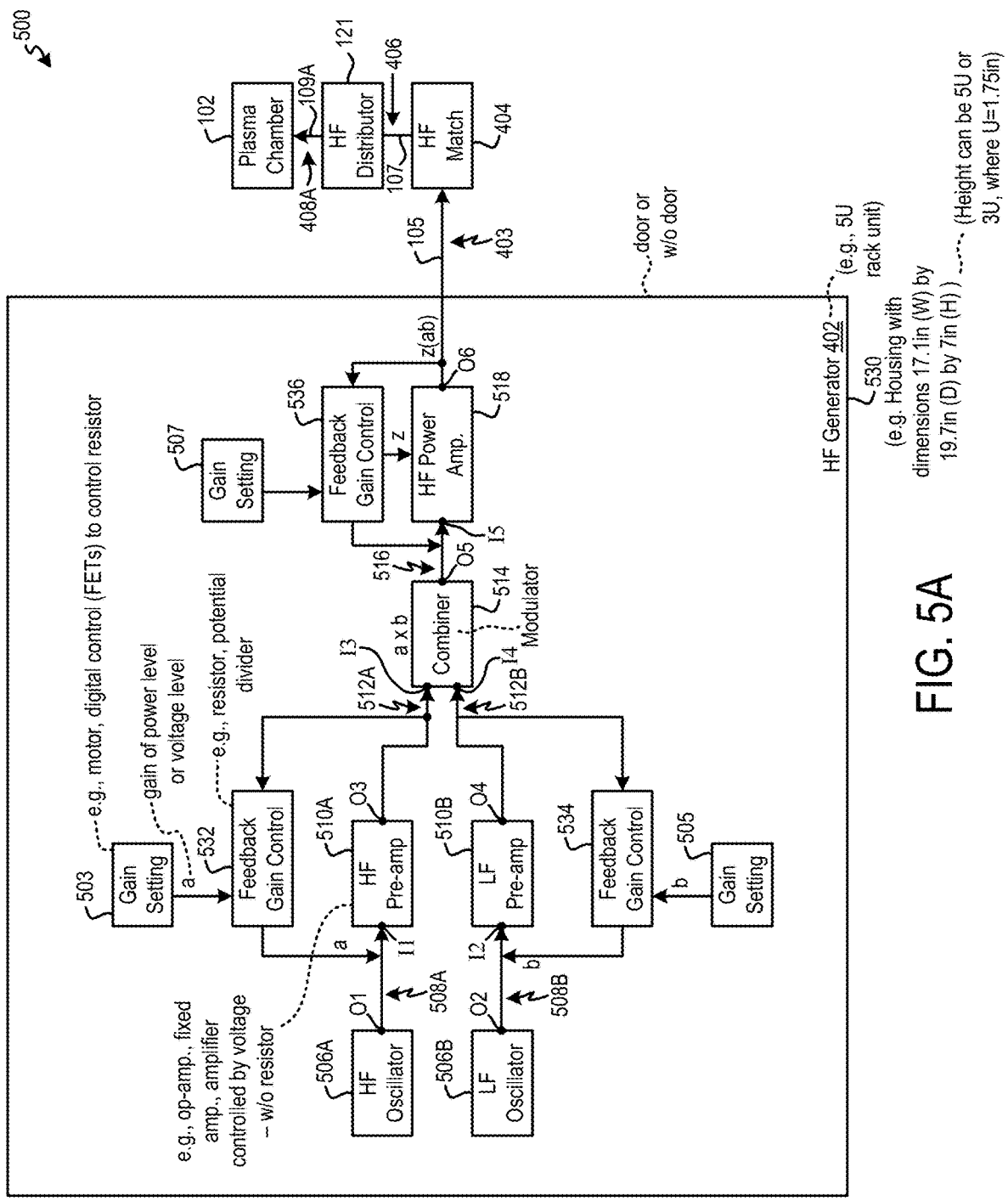
FIG. 5A is a diagram of an embodiment of a system to illustrate an embodiment of the HF generator.

FIG. 5A is a diagram of an embodiment of a system 500 to illustrate an embodiment of the HF generator 402. The system 500 includes the HF generator 402, the HF match 404, the HF distributor 121, and the plasma chamber 102.

The HF generator 402 includes components, such as, an HF oscillator 506A, an LF oscillator 506B, a feedback gain control 532, a gain setting 503, an HF pre-amplifier 510A, a gain setting 505, a feedback gain control 534, an LF pre-amplifier 510B, a combiner 514, an HF power amplifier 518, a feedback gain control 536, and a gain setting 507. The HF generator 402 has a housing 530, which is made from a metal. The housing 530 of the HF generator 402 encloses components of the HF generator 402, such as the HF oscillator 506A, the LF oscillator 506B, the feedback gain control 532, the gain setting 503, the HF pre-amplifier 510A, the gain setting 505, the feedback gain control 534, the LF pre-amplifier 510B, the combiner 514, the HF power amplifier 518, the feedback gain control 536, and the gain setting 507. As an example, the housing 530 has a width of 17.1 inches, a depth of 19.7 inches, and a height of 7 inches. As another example, the housing 530 has a width of 16 inches, a depth of 15 inches, and a height of 5 inches. It should be noted that a height of the housing 530 can be 3U, 5U, or 7U, where U is equal to 1.75 inches. For example, the HF generator 402 can be provided as a 3U rack unit or a 5U rack unit or a 7U rack unit. The housing 530 is supported by a rack. As yet another example, a size of the housing 530 is the same as that of a high frequency generator housing (not shown). The high frequency generator housing (not shown) is used with a low frequency generator housing (not shown) to supply RF power via multiple matches to the stations 1 through 4.

The components of the housing 530 of the HF generator 402 are accessible via a door of the housing 530 or via a side of the housing 530. For example, the user opens the door of the housing 530 of the HF generator 402 to gain access to one or more of the components of the housing 530. As another example, the user removes a side wall or a top wall of the housing 530 of the HF generator 402 to access one or more of the components of the housing 530.

An example of the HF oscillator 506A is an electronic oscillator that oscillates at a high frequency, such as a frequency ranging from and including 10 MHz to 100 MHz. To illustrate, the HF oscillator 506A is an electronic circuit that produces a periodic oscillating signal, such as a sine wave, having the high frequency. As another illustration, the HF oscillator 506A oscillates at a frequency of 13.56 MHz. As yet another illustration, the HF oscillator 506A oscillates at a frequency of 27 MHz. As another illustration, the HF oscillator 506A oscillates at a frequency of 60 MHz. An example of the LF oscillator 506B is an electronic oscillator that oscillates at the low frequency, such as a frequency ranging from and including 100 kilohertz (kHz) to 3 MHz. To illustrate, the LF oscillator 506B is an electronic circuit that produces a periodic oscillating signal, such as a sine wave, having the low frequency. As another illustration, the LF oscillator 506B oscillates at a frequency of 2 MHz. As yet another illustration, the LF oscillator 506B oscillates at a frequency of 400 kHz.

Moreover, examples of a feedback gain control, as used herein, include a resistor and a voltage divider. For example, the feedback gain control 532 is a resistor, the feedback gain control 534 is another resistor, and the feedback gain control 536 is yet another resistor. As used herein, a voltage divider, also known as a potential divider, is a passive linear circuit that produces an output voltage that is a fraction of its input voltage. For example, an input terminal of a voltage divider is coupled to an output terminal O3 of the HF pre-amplifier 510A and an output terminal of the voltage divider is coupled to an input terminal I1 of the HF pre-amplifier 510A. As another example, an input terminal of a voltage divider is coupled to an output terminal O4 of the LF pre-amplifier 510B and an output terminal of the voltage divider is coupled to an input terminal I2 of the LF pre-amplifier 510B. As yet another example, an input terminal of a voltage divider is coupled to an output terminal O6 of the HF power amplifier 518 and an output terminal of the voltage divider is coupled to an input terminal I5 of the HF power amplifier 518.

An example of a gain setting, as used herein, includes a motor and a connection for connecting the motor to a corresponding feedback gain control. For example, the gain setting 503 includes a motor and a connection, and the motor is coupled to the feedback gain control 532 via the connection. As another example, the gain setting 505 includes a motor and a connection, and the motor is coupled to the feedback gain control 534 via the connection. As yet another example, the gain setting 507 includes a motor and a connection, and the motor is coupled to the feedback gain control 536 via the connection. An example of a connection, as used herein, that couples a motor to a corresponding feedback gain control includes one or more rods that connect the motor to the corresponding feedback gain control. Another example of a connection, as used herein, that couples a motor to a corresponding feedback gain control includes one or more rods and one or more gears that couple the motor to the corresponding feedback gain control. Another example of a gain setting, as used herein, includes transistors, such as field effect transistors (FETs) or bipolar junction transistors (BJTs). Yet another example of a gain setting, as used herein, include a voltage source whose voltage is controlled to control the gain of a corresponding feedback gain control that is coupled to the gain setting.

As another example, an example of the combination of a gain setting and a corresponding feedback gain control, as used herein, includes a variable voltage supply, such as a variable power supply. For example, a combination of the gain setting 503 and the feedback gain control 532 is a variable voltage supply and a combination of the gain setting 505 and the feedback gain control 534 is another variable voltage supply. Moreover, a combination of the gain setting 507 and the feedback gain control 536 is a variable voltage supply.

Examples of a pre-amplifier, as used herein, include an operational amplifier, a fixed amplifier, and an amplifier whose gain is controlled by a voltage. As an example, an operational amplifier as used herein has a differential input terminal and a single output terminal. The differential input terminal has a positive input terminal and the negative input terminal. When the pre-amplifier is an operational amplifier, a positive input terminal of the operational amplifier is coupled to an output terminal of the corresponding oscillator, such as the HF oscillator 506A or the LF oscillator 506B, and a negative input terminal of the operational amplifier is coupled to the ground potential. For example, a positive input terminal of an operational amplifier coupled to an output terminal O1 of the HF oscillator 506A and a negative input terminal of the operational amplifier is coupled to the ground potential. As another example, a positive input terminal of an operational amplifier is coupled to an output terminal O2 of the LF oscillator 506B and a negative input terminal of the operational amplifier is coupled to the ground potential.

Similarly, examples of a power amplifier, as used herein, include an operational amplifier, a fixed amplifier, and an amplifier whose gain is controlled by a voltage. When the power amplifier is the operational amplifier, a positive input terminal of the operational amplifier is coupled to an output terminal O5 of the combiner 514, and a negative input terminal of the operational amplifier is coupled to the ground potential.

Examples of the combiner 514 includes a modulator and a multiplier. The combiner 514 can be implemented as an ASIC, or a PLD, or a multiplier circuit, or a controller, or a processor.

The output terminal O1 of the HF oscillator 506A is coupled to the input terminal I1 of the HF pre-amplifier 510A and the output terminal O2 of the LF oscillator 506B is coupled to the input terminal I2 of the LF pre-amplifier 510B. Moreover, the output terminal O3 of the HF pre-amplifier 510A is coupled to an input terminal I3 of the combiner 514 and the output terminal O4 of the LF pre-amplifier 510B is coupled to another input terminal I4 of the combiner 514. The output terminal O5 of the combiner 514 is coupled to an input terminal I5 of the HF power amplifier 518 and an output terminal O6 of the HF power amplifier 518 is coupled to the input terminal of the HF match 404 via the RF cable 105.

Moreover, the output terminal O3 of the HF pre-amplifier 510A is coupled to one end of the feedback gain control 532 and another end of the feedback gain control 532 is coupled to the input terminal I1 of the HF pre-amplifier 510A and to the output terminal O1 of the HF oscillator 506A. Similarly, the output terminal O4 of the LF pre-amplifier 510B is coupled to one end of the feedback gain control 534 and another end of the feedback gain control 534 is coupled to the input terminal I2 of the LF pre-amplifier 510B and to the output terminal O2 of the LF oscillator 506B. Also, the output terminal O6 of the HF power amplifier 518 is coupled to one end of the feedback gain control 536 and another end of the feedback gain control 536 is coupled to the input terminal I5 of the HF power amplifier 518 and to the output terminal O5 of the combiner 514.

The HF oscillator 506A oscillates to generate a high frequency RF signal 508A and the LF oscillator 506B oscillates to generate a low frequency RF signal 508B. The high frequency RF signal 508A has the high frequency and the low frequency RF signal 508B has the low frequency. The high frequency RF signal 508A is supplied from the output terminal O1 of the HF oscillator 506A to the input terminal I1 of the HF pre-amplifier 510A via a conductor that couples the output terminal O1 to the input terminal I1. Similarly, the low frequency RF signal 508B is supplied from the output terminal O2 of the LF oscillator 506B to the input terminal I2 of the LF pre-amplifier 510B via a conductor that couples the output terminal O2 to the input terminal I2.

The HF pre-amplifier 510A amplifies a variable of the high frequency RF signal 508A according to a gain value "a" to output a variable of an amplified high frequency RF signal 512A at the output terminal O3 of the HF pre-amplifier 510A. A variable, as used herein, is power or voltage. The variable of the amplified high frequency RF signal 512A is amplified by the gain value "a" with respect to the variable of the high frequency RF signal 508A. The gain value "a" is controlled by a parameter, such as a resistance or voltage, of the feedback gain control 532. The parameter of the feedback gain control 532 is controlled by the gain setting 503, which is coupled to the probe control and system control 110 of FIG. 1. For example, the processor of the probe control and system control 110 sends a control signal to the motor of the gain setting 503 to rotate a rotor of the motor with respect to a stator of the motor. Once the motor rotates, a length of the resistor of the feedback gain control 532 changes to change a resistance of the resistor. The change in the resistance of the resistor changes the gain value "a" to control a gain provided by the HF pre-amplifier 510A. As another example, the processor of the probe control and system control 110 sends a control signal to a variable voltage supply, which is an example of the combination of the gain setting 503 and the feedback gain control 532, to change an amount of voltage of the variable voltage supply. The change in the amount of voltage of the variable voltage supply changes a voltage at the input terminal I1 of the HF pre-amplifier 510A to change the gain value "a" of the HF pre-amplifier 510A.

Similarly, the LF pre-amplifier 510B amplifies a variable of the low frequency RF signal 508B according to a gain value "b" to output a variable of an amplified low frequency RF signal 512B at the output terminal O4 of the LF pre-amplifier 510B. The variable of the amplified low frequency RF signal 512B is amplified by the gain value "b" with respect to the variable of the low frequency RF signal 508B. The gain value "b" is controlled by a parameter, such as a resistance or a voltage, of the feedback gain control 534. The parameter of the feedback gain control 534 is controlled by the gain setting 505, which is coupled to the probe control and system control 110 of FIG. 1. For example, the processor of the probe control and system control 110 sends a control signal to the motor of the gain setting 505 to rotate a rotor of the motor with respect to a stator of the motor. Once the motor rotates, a length of the resistor of the feedback gain control 534 changes to change a resistance of the resistor. The change in the resistance of the resistor changes the gain value "b" to control a gain provided by the LF pre-amplifier 510B. As another example, the processor of the probe control and system control 110 sends a control signal to a variable voltage supply, which is an example of the combination of the gain setting 505 and the feedback gain control 534, to change an amount of voltage of the variable voltage supply. The change in the amount of voltage of the variable voltage supply changes a voltage at the input terminal I2 of the LF pre-amplifier 510B to change the gain value "b" of the LF pre-amplifier 510B.

The combiner 514 receives at its input terminal I3 the amplified high frequency RF signal 512A from the output terminal O3 of the HF pre-amplifier 510A via a conductor, which couples the output terminal O3 to the input terminal I3 of the combiner 514. Moreover, the combiner 514 receives at its input terminal I4 the amplified low frequency RF signal 512B from the output terminal O4 of the LF pre-amplifier 510B via a conductor, which couples the output terminal O4 to the input terminal I4 of the combiner 514. The combiner 514 combines, such as modulates or multiplies, the variable of the amplified high frequency RF signal 512A with the variable of the amplified low frequency RF signal 512B to generate a variable of a combined RF signal 516. For example, the combiner 514 multiplies power of the amplified high frequency RF signal 512A with power of the amplified low frequency RF signal 512B to generate the combined RF signal 516 having a product of the powers of the amplified high frequency RF signal 512A and the amplified low frequency RF signal 512B.

The combined RF signal 516 is supplied from the output terminal O5 of the combiner 516 to the input terminal I5 of the HF power amplifier 518 via a conductor that couples the output terminal O5 to the input terminal I5. The HF power amplifier 518 amplifies the variable of the combined RF signal 516 according to a gain value "Z" to output a variable of the RF signal 403 at the output terminal O6. The RF signal 403 is an amplified RF signal, which is amplified by the gain value "Z" with respect to the combined RF signal 516. The gain value "Z" is controlled by a parameter, such as a resistance or a voltage, of the feedback gain control 536. The parameter of the feedback gain control 536 is controlled by the gain setting 507, which is coupled to the probe control and system control 110 of FIG. 1. For example, the processor of the probe control and system control 110 sends a control signal to the motor of the gain setting 507 to rotate a rotor of the motor with respect to a stator of the motor. Once the motor rotates, a length of the resistor of the feedback gain control 536 changes to change a resistance of the resistor. The change in the resistance of the resistor changes the gain value "Z" to control a gain provided by the RF signal 403. As another example, the processor of the probe control and system control 110 sends a control signal to a variable voltage supply, which is an example of the combination of the gain setting 507 and the feedback gain control 536, to change an amount of voltage of the variable voltage supply. The change in the amount of voltage of the variable voltage supply changes a voltage at the input terminal I5 of the HF power amplifier 518 to change the gain value "Z" of the HF power amplifier 518. The RF signal 403 is sent from the output terminal O6 of the HF power amplifier 518 via the RF cable 105 to the input terminal of the HF match 404.

Figure 5B:
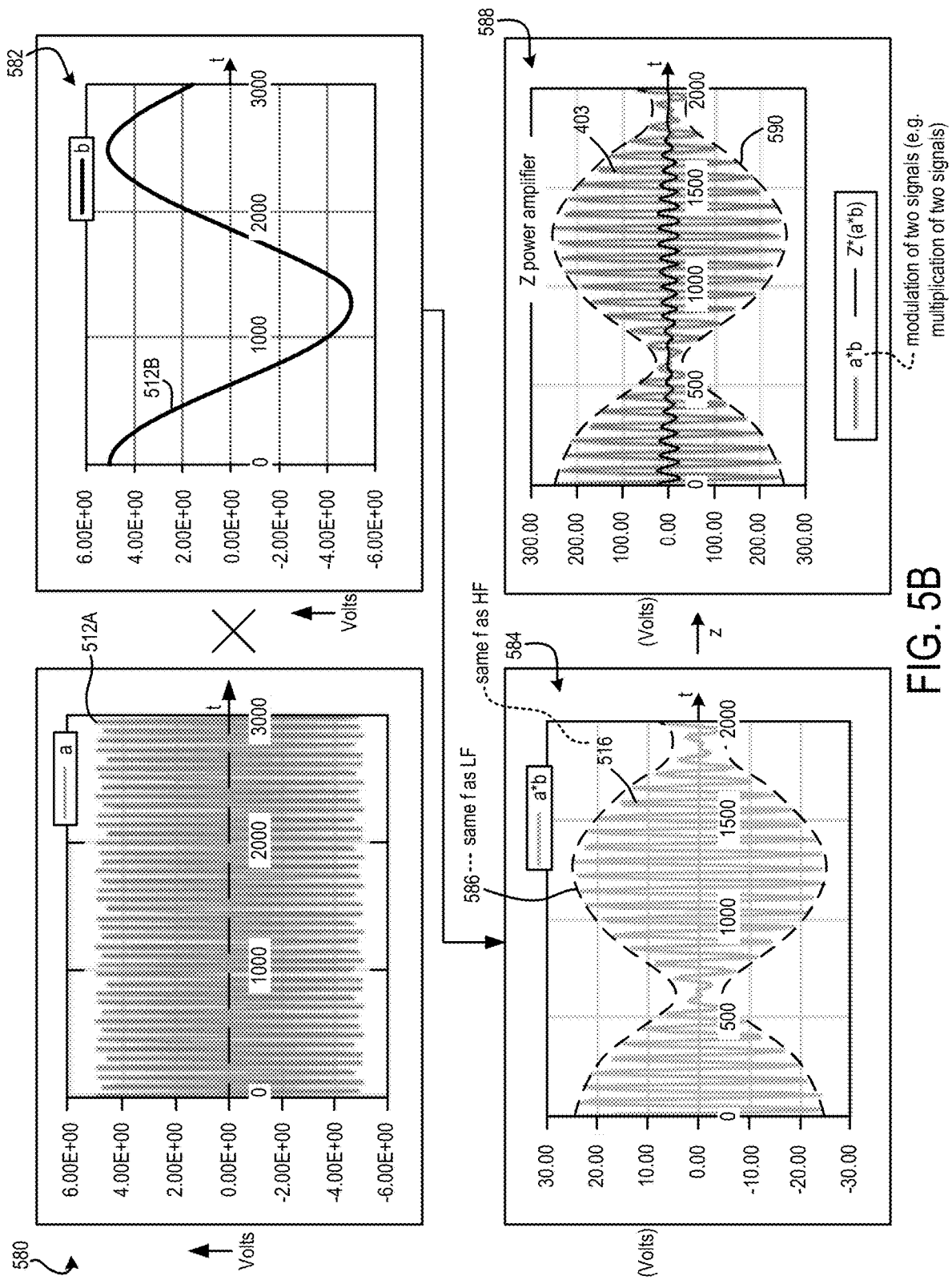
FIG. 5B shows embodiments of graphs to illustrate an amplified high frequency RF signal that is output from an HF pre-amplifier of FIG. 5A, an amplified low frequency RF signal that is output from an LF pre-amplifier of FIG. 5A, a combined RF signal that is generated by a combiner of FIG. 5A, and an RF signal that is output from the HF generator of FIG. 4.

FIG. 5B shows embodiments of graphs 580, 582, 584, and 588 to illustrate the amplified high frequency RF signal 512A that is output from the HF pre-amplifier 510A of FIG. 5A, the amplified low frequency RF signal 512B that is output from the LF pre-amplifier 510B of FIG. 5A, the combined RF signal 516 that is generated by the combiner 514 of FIG. 5A, and the RF signal 403 that is output from the HF generator 402 of FIG. 5A. The graph 580 plots a voltage of the amplified high frequency RF signal 512A versus time t. Similarly, the graph 582 plots a voltage of the amplified low frequency RF signal 512B versus the time t, the graph 584 plots a voltage of the combined RF signal 516 versus the time t, and the graph 588 plots a voltage of the RF signal 403 versus the time t. The amplified high frequency RF signal 512A has the gain value of "a" with respect to the high frequency RF signal 508A output from the HF oscillator 506A. For example, the HF pre-amplifier 510A amplifies a voltage of the high frequency RF signal 508A to output the voltage of the amplified high frequency RF signal 512A. Moreover, the amplified low frequency RF signal 512B has the gain value of "b" with respect to the low frequency RF signal 508B output from the HF oscillator 506B. As an example, the LF pre-amplifier 510B amplifies a voltage of the low frequency RF signal 508B to output the voltage of the amplified low frequency RF signal 512B.

The combiner 514 multiplies the voltage of the amplified high frequency RF signal 512A with the voltage of the amplified low frequency RF signal 512B to generate the voltage of the combined RF signal 516. For example, the combiner 514 multiplies a voltage value of the amplified high frequency RF signal 512A at a time of 1000 milliseconds with a voltage value of the amplified RF signal 512B at the time of 1000 milliseconds to generate a voltage value of the combined RF signal 516 at the time of 1000 milliseconds. In this example, the combiner 514 multiplies a voltage value of the amplified high frequency RF signal 512A at a time of 2000 milliseconds with a voltage value of the amplified RF signal 512B at the time of 2000 milliseconds to generate a voltage value of the combined RF signal 516 at the time of 2000 milliseconds.

The combined RF signal 516 has an envelope 586, which has the same frequency as that of the low frequency of the amplified RF signal 512B. For example, when a frequency of the amplified RF signal 512B is 2 MHz, the frequency of the envelope 586 of the combined RF signal 516 is also 2 MHz. As another example, when a frequency of the amplified RF signal 512B is 400 kHz, the frequency of the envelope 586 of the combined RF signal 516 is also 400 kHz. An example of an envelope, as used herein, is a peak-to-peak amplitude, such as a peak-to-peak amplitude of power or a peak-to-peak amplitude of voltage. Another example of an envelope, as used herein, is a zero-to-peak amplitude, such as a zero-to-peak amplitude of power or a zero-to-peak amplitude of voltage. Moreover, the combined RF signal 516 has the same frequency as that of the high frequency of the amplified RF signal 512A. For example, when the high frequency of the amplified RF signal 512A is 27 MHz, the frequency of the combined RF signal 516 is 27 MHz. As another example, when the high frequency of the amplified RF signal 512A is 60 MHz, the frequency of the combined RF signal 516 is 60 MHz.

The HF power amplifier 518 of FIG. 5A amplifies the voltage of the combined RF signal 516 by the gain value "Z" to output a voltage of the RF signal 403. The RF signal 403 has an envelope 590, which has the same frequency as that of the low frequency of the amplified RF signal 512B. For example, when a frequency of the amplified RF signal 512B is 2 MHz, the frequency of the envelope 590 of the RF signal 403 is also 2 MHz. As another example, when a frequency of the amplified RF signal 512B is 400 kHz, the frequency of the envelope 590 of the RF signal 403 is also 400 kHz. Moreover, the RF signal 403 has the same frequency as that of the high frequency of the amplified RF signal 512A. For example, when the high frequency of the amplified RF signal 512A is 27 MHz, the frequency of the RF signal 403 is 27 MHz. As another example, when the high frequency of the amplified RF signal 512A is 60 MHz, the frequency of the RF signal 403 is 60 MHz.

Because the RF signal 403 has the high frequency of the high frequency RF signal 508A and has the envelope having the low frequency of the low frequency RF signal 508B, the RF signal 403 controls density of plasma within the stations 1 through 4 and energy of the plasma within the stations 1 through 4. For example, by changing, such as increasing or decreasing the gain value "a", the energy of plasma within the stations 1 through 4 is changed. As another example, by changing, such as increasing or decreasing the gain value "b", the density of plasma within the stations 1 through 4 is changed. Furthermore, by changing, such as increasing or decreasing the gain value "Z", the energy and density of plasma within the stations 1 through 4 is changed.

In some embodiments, the combiner 514 multiplies the power of the amplified high frequency RF signal 512A with the power of the amplified low frequency RF signal 512B to generate the power of the combined RF signal 516. For example, the combiner 514 multiplies a power value of the amplified high frequency RF signal 512A at the time of 1000 milliseconds with a power value of the amplified RF signal 512B at the time of 1000 milliseconds to generate a power value of the combined RF signal 516 at the time of 1000 milliseconds. In this example, the combiner 514 multiplies a power value of the amplified high frequency RF signal 512A at the time of 2000 milliseconds with a power value of the amplified RF signal 512B at the time of 2000 milliseconds to generate a power value of the combined RF signal 516 at the time of 2000 milliseconds.

Figure 6:
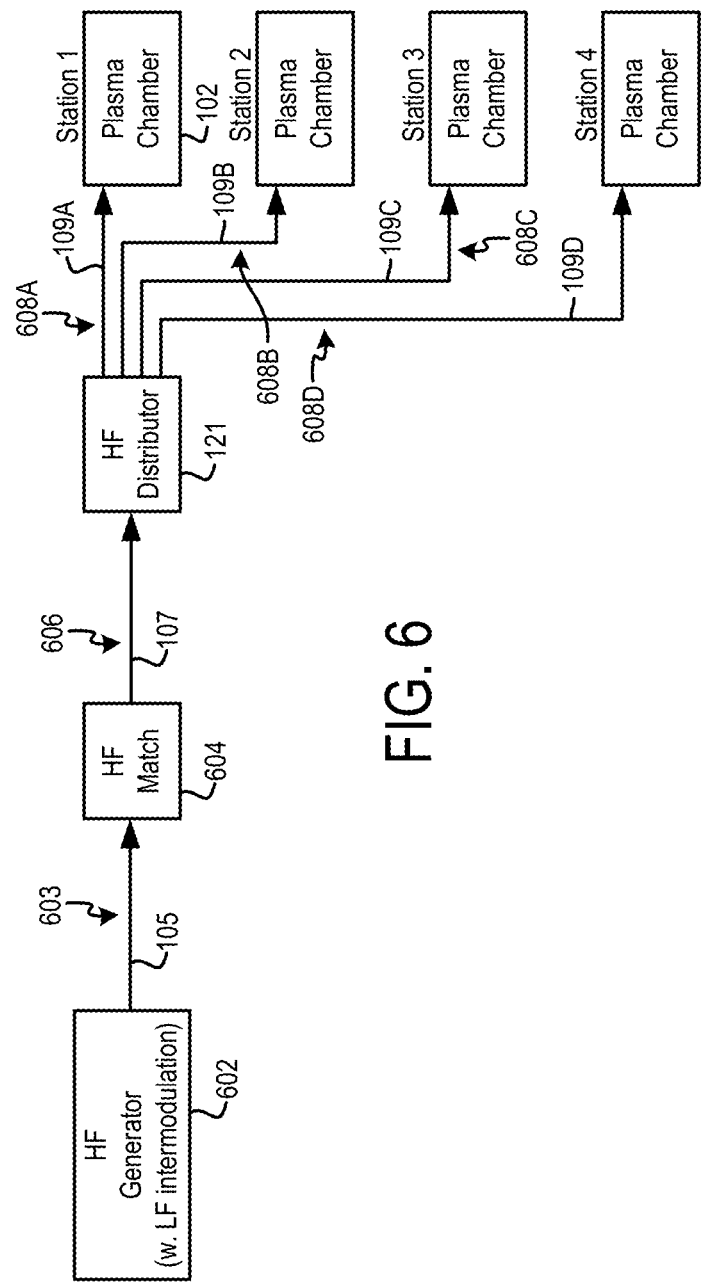
FIG. 6 is a diagram of an embodiment of a system to illustrate use of an RF generator of FIG. 1 as an HF generator with LF intermodulation.

FIG. 6 is a diagram of an embodiment of a system 600 to illustrate use of the RF generator 104 as a high frequency generator with low frequency (LF) intermodulation. The system 600 includes an HF generator 602, which is an example of the RF generator 104 of FIG. 1. The system 600 further includes an HF match 604, which is an example of the match network 106 of FIG. 1. The system 600 also includes the distributor 121. The system 600 includes the plasma chamber 102, the station 2, the station 3, and the station 4. An output terminal of the HF generator 602 is coupled to an input terminal of the HF match 604 via the RF cable 105. Moreover an output terminal of the HF match 604 is coupled to an input terminal of the distributor 121 via the RF transmission line 107.

The HF generator 602 generates an RF signal 603 and supplies the high frequency RF signal 603 via the RF cable 105 to the input terminal of the HF match 604. For example, the HF generator 602 performs the LF intermodulation by adding RF power of the low frequency RF signal 508A (see FIG. 7A) and RF power of the high frequency RF signal 508B (see FIG. 7A) to generate the RF signal 603. The RF signal 603 has an envelope having the low frequency of the low frequency RF signal 508A. The HF match 604 receives the RF signal 603 and matches an impedance of a load coupled to the output terminal of the HF match 604 with an impedance of a source coupled to the input terminal of the HF match 604 to output a modified RF signal 606. The RF signal 603 is an example of the RF signal 111 of FIG. 1 and the modified RF signal 606 is an example of the modified RF signal 113 of FIG. 1. An example of the load coupled to the output terminal of the HF match 604 includes the RF transmission line 107, the distributor 121, the RF connectors 109A-109D, and the stations 1-4. Moreover an example of the source coupled to the input terminal of the HF match 604 includes the HF generator 602 and the RF cable 105.

The distributor 121 receives the modified RF signal 606 from the output terminal of the HF match 604 via the RF transmission line 107 and distributes RF power of the modified RF signal 606 into a plurality of RF signals 608A, 608B, 608C, and 608D. The RF signal 608A is sent via the first output RF connector of the distributor 121 and the RF connector 109A to the lower electrode of the plasma chamber 102 of FIG. 1 and the RF signal 608B is sent via the second output RF connector of the distributor 121 and the RF connector 109B to the lower electrode of the station 2. Similarly, the RF signal 608C is sent via the third output RF connector of the distributor 121 and the RF connector 109C to the lower electrode of the station 3 and the RF signal 608D is sent via the fourth output RF connector of the distributor 121 and the RF connector 109D to the lower electrode of the station 4.

Figure 7A:
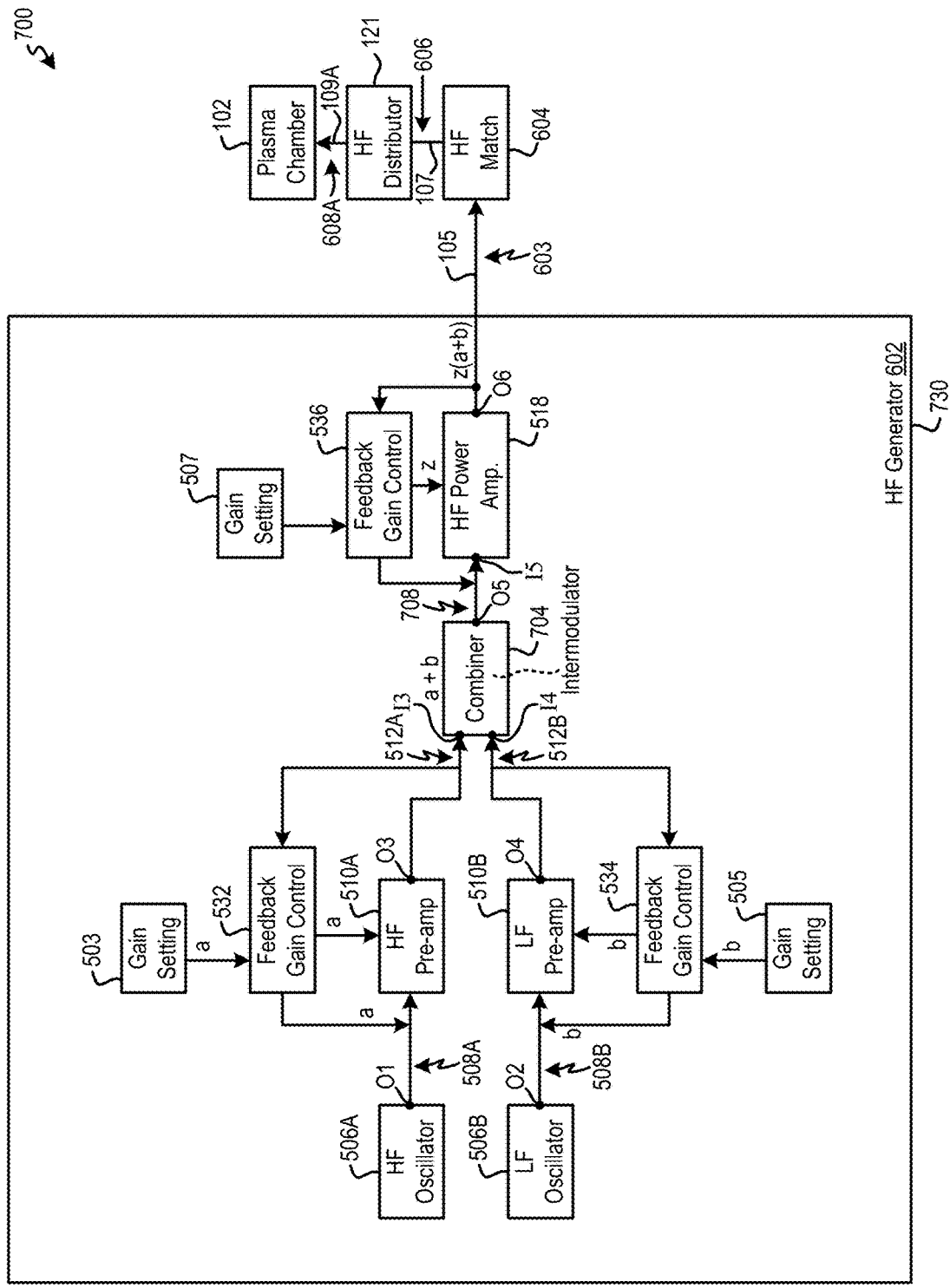
FIG. 7A is a diagram of an embodiment of a system to illustrate an embodiment of the HF generator of FIG. 6.

FIG. 7A is a diagram of an embodiment of a system 700 to illustrate an embodiment of the HF generator 602. The system 700 includes the HF generator 602, the HF match 604, the HF distributor 121, and the plasma chamber 102.

The HF generator 602 includes the HF oscillator 506A, the LF oscillator 506B, the feedback gain control 532, the gain setting 503, the HF pre-amplifier 510A, the gain setting 505, the feedback gain control 534, the LF pre-amplifier 510B, a combiner 704, the HF power amplifier 518, the feedback gain control 536, and the gain setting 507. The HF generator 402 has a housing 730, which is made from a metal. The housing 730 of the HF generator 402 encloses components of the HF generator 602, such as the HF oscillator 506A, the LF oscillator 506B, the feedback gain control 532, the gain setting 503, the HF pre-amplifier 510A, the gain setting 505, the feedback gain control 534, the LF pre-amplifier 510B, the combiner 704, the HF power amplifier 518, the feedback gain control 536, and the gain setting 507. As an example, the housing 730 has a width of 17.1 inches, a depth of 19.7 inches, and a height of 7 inches. As another example, the housing 730 has a width of 16 inches, a depth of 15 inches, and a height of 5 inches. It should be noted that a height of the housing 730 can be 3U, 5U, or 7U. For example, the HF generator 602 can be provided as a 3U rack unit or a 5U rack unit or a 7U rack unit. The housing 730 is supported by a rack. In one embodiment, a size of the housing 730 is the same as that of the high frequency generator housing (not shown).

The components of the housing 730 of the HF generator 602 are accessible via a door of the housing or via a side of the housing 730. For example, the user opens the door of the housing 730 of the HF generator 602 to gain access to one or more of the components of the housing 730. As another example, the user removes a side wall or a top wall of the housing 730 of the HF generator 602 to access one or more of the components of the housing 730.

Examples of the combiner 704 include an intermodulator and an adder. The combiner 704 can be implemented as an ASIC, or a PLD, or an adder circuit, or a controller, or a processor.

The output terminal O3 of the HF pre-amplifier 510A is coupled to the input terminal I3 of the combiner 704 and the output terminal O4 of the LF pre-amplifier 510B is coupled to another input terminal I4 of the combiner 704. The output terminal O5 of the combiner 704 is coupled to the input terminal I5 of the HF power amplifier 518. Also, the other end of the feedback gain control 536 is coupled to the output terminal O5 of the combiner 704.

The combiner 704 receives at its input terminal I3 the amplified high frequency RF signal 512A from the output terminal O3 of the HF pre-amplifier 510A via a conductor, which couples the output terminal O3 to the input terminal I3 of the combiner 704. Moreover, the combiner 704 receives at its input terminal I4 the amplified low frequency RF signal 512B from the output terminal O4 of the LF pre-amplifier 510B via a conductor, which couples the output terminal O4 to the input terminal I4 of the combiner 704. The combiner 704 combines, such as intermodulates or adds, the variable of the amplified high frequency RF signal 512A with the variable of the amplified low frequency RF signal 512B to generate a variable of a combined RF signal 708. For example, the combiner 704 adds power of the amplified high frequency RF signal 512A and power of the amplified low frequency RF signal 512B to generate the combined RF signal 708 having a sum or a total of the powers of the amplified high frequency RF signal 512A and the amplified low frequency RF signal 512B.

The combined RF signal 708 is supplied from the output terminal O5 of the combiner 704 to the input terminal I5 of the HF power amplifier 518 via a conductor that couples the output terminal O5 to the input terminal I5. The HF power amplifier 518 amplifies the variable of the combined RF signal 708 according to the gain value "Z" to output a variable of the RF signal 603 at the output terminal O6. The RF signal 603 is an amplified RF signal, which is amplified by the gain value "Z" with respect to the combined RF signal 708. The RF signal 603 is sent from the output terminal O6 of the HF power amplifier 518 via the RF cable 105 to the input terminal of the HF match 404. Because the RF signal 603 has the high frequency of the high frequency RF signal 508A and has the envelope having the low frequency of the low frequency RF signal 508B, the RF signal 603 controls density of plasma within the stations 1 through 4 and energy of the plasma within the stations 1 through 4.

Figure 7B:
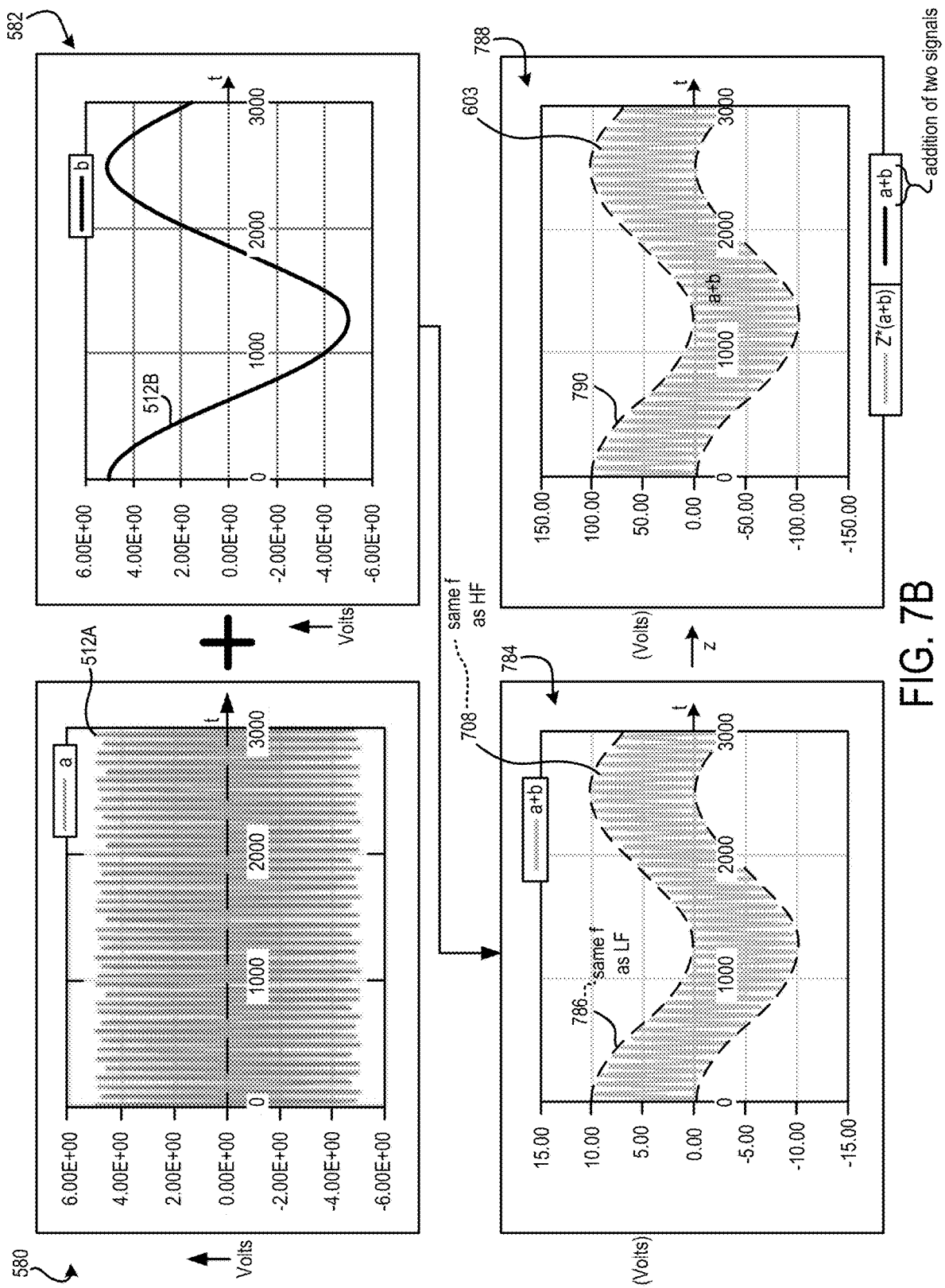
FIG. 7B shows embodiments of graphs to illustrate the amplified high frequency RF signal that is output from the HF pre-amplifier of FIG. 5A, the amplified low frequency RF signal that is output from the LF pre-amplifier of FIG. 5A, a combined RF signal that is generated by a combiner of FIG. 7A, and an RF signal that is output from the HF generator of FIG. 7A.

FIG. 7B shows embodiments of the graphs 580 and 582, a graph 784, and a graph 788 to illustrate the combined RF signal 708 that is generated by the combiner 704 of FIG. 7A, and to illustrate the RF signal 603. The graph 784 plots a voltage of the combined RF signal 708 versus the time t, and the graph 788 plots a voltage of the RF signal 603 versus the time t.

The combiner 704 adds the voltage of the amplified high frequency RF signal 512A and the voltage of the amplified low frequency RF signal 512B to generate the voltage of the combined RF signal 708. For example, the combiner 704 adds a voltage value of the amplified high frequency RF signal 512A at a time of 1000 milliseconds with a voltage value of the amplified RF signal 512B at the time of 1000 milliseconds to generate a voltage value of the combined RF signal 708 at the time of 1000 milliseconds. In this example, the combiner 704 adds a voltage value of the amplified high frequency RF signal 512A at a time of 2000 milliseconds with a voltage value of the amplified RF signal 512B at the time of 2000 milliseconds to generate a voltage value of the combined RF signal 708 at the time of 2000 milliseconds.

The combined RF signal 708 has an envelope 786, which has the same frequency as that of the low frequency of the amplified RF signal 512B. For example, when a frequency of the amplified RF signal 512B is 2 MHz, the frequency of the envelope 786 of the combined RF signal 708 is also 2 MHz. As another example, when a frequency of the amplified RF signal 512B is 400 kHz, the frequency of the envelope 786 of the combined RF signal 708 is also 400 kHz. Moreover, the combined RF signal 708 has the same frequency as that of the high frequency of the amplified RF signal 512A. For example, when the high frequency of the amplified RF signal 512A is 27 MHz, the frequency of the combined RF signal 708 is 27 MHz. As another example, when the high frequency of the amplified RF signal 512A is 60 MHz, the frequency of the combined RF signal 708 is 60 MHz.

The HF power amplifier 518 of FIG. 5A amplifies the voltage of the combined RF signal 708 by the gain value "Z" to output voltage of the RF signal 603. The RF signal 603 has an envelope 790, which has the same frequency as that of the low frequency of the amplified RF signal 512B. For example, when a frequency of the amplified RF signal 512B is 2 MHz, the frequency of the envelope 790 of the RF signal 603 is also 2 MHz. As another example, when a frequency of the amplified RF signal 512B is 400 kHz, the frequency of the envelope 790 of the RF signal 603 is also 400 kHz. Moreover, the RF signal 603 has the same frequency as that of the high frequency of the amplified RF signal 512A. For example, when the high frequency of the amplified RF signal 512A is 27 MHz, the frequency of the RF signal 603 is 27 MHz. As another example, when the high frequency of the amplified RF signal 512A is 60 MHz, the frequency of the RF signal 603 is 60 MHz.

In some embodiments, the combiner 704 adds the power of the amplified high frequency RF signal 512A and the power of the amplified low frequency RF signal 512B to generate the power of the combined RF signal 708. For example, the combiner 704 adds a power value of the amplified high frequency RF signal 512A at the time of 1000 milliseconds with a power value of the amplified RF signal 512B at the time of 1000 milliseconds to generate a power value of the combined RF signal 708 at the time of 1000 milliseconds. In this example, the combiner 704 adds a power value of the amplified high frequency RF signal 512A at the time of 2000 milliseconds to a power value of the amplified RF signal 512B at the time of 2000 milliseconds to generate a power value of the combined RF signal 708 at the time of 2000 milliseconds.

Figure 8:
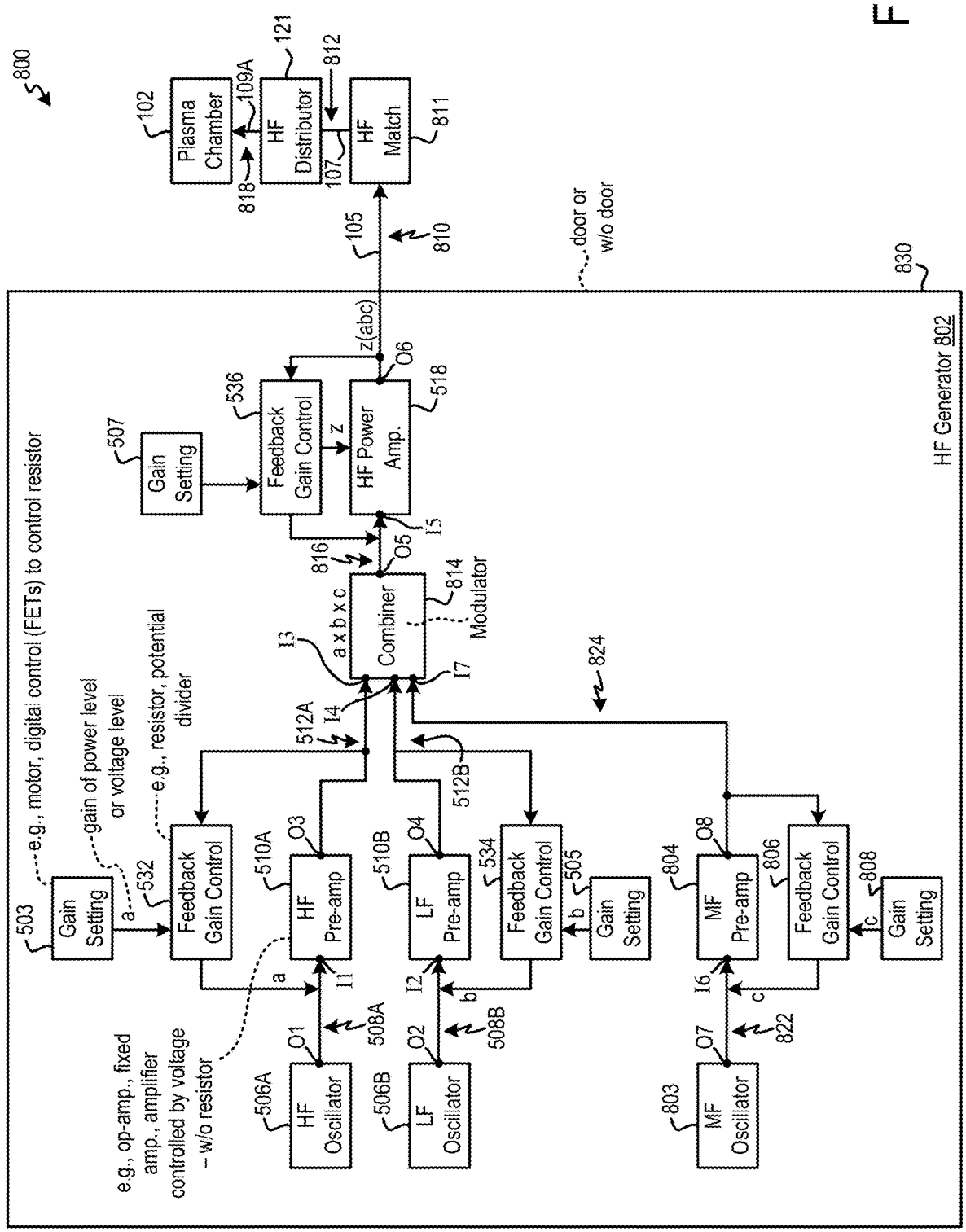
FIG. 8 is a diagram of an embodiment of a system to illustrate an embodiment of an HF generator in which variables associated with three frequencies are modulated.

FIG. 8 is a diagram of an embodiment of a system 800 to illustrate an embodiment of an HF generator 802. The system 800 includes the HF generator 802, an HF match 811, the HF distributor 121, and the plasma chamber 102. The HF generator 802 is an example of the RF generator 104 of FIG. 1 and the HF match 811 is an example of the match network 106 of FIG. 1.

The HF generator 802 includes the components of the HF generator 402 of FIG. 5A except that the HF generator 802 excludes the combiner 514. In addition, the HF generator 802 includes additional components, such as a medium frequency (MF) oscillator 802, an MF pre-amplifier 804, a feedback gain control 806, a gain setting 808, and a combiner 814. The HF generator 802 has a housing 830, which is made from a metal. The housing 830 of the HF generator 802 encloses the components of the HF generator 802. As an example, the housing 830 has a width of 17.1 inches, a depth of 19.7 inches, and a height of 7 inches. As another example, the housing 830 has a width of 16 inches, a depth of 15 inches, and a height of 5 inches. It should be noted that a height of the housing 830 can be 3U, 5U, or 7U. For example, the HF generator 802 can be provided as a 3U rack unit or a 5U rack unit or a 7U rack unit. The housing 830 is supported by a rack. As yet another example, a size of the housing 830 is the same as that of the high frequency generator housing (not shown).

The components of the housing 830 of the HF generator 802 are accessible via a door of the housing 830 or via a side of the housing 530. For example, the user opens the door of the housing 830 of the HF generator 802 to gain access to one or more of the components of the housing 830. As another example, the user removes a side wall or a top wall of the housing 830 of the HF generator 802 to access one or more of the components of the housing 830.

An example of the MF oscillator 803 is an electronic oscillator that oscillates at a medium frequency, such as a frequency ranging from 3 MHz to 20 MHz. To illustrate, the MF oscillator 803 is an electronic circuit that produces a periodic oscillating signal, such as a sine wave, having the medium frequency. Moreover, examples of the feedback gain control 806 include a resistor and a voltage divider. To illustrate, an input terminal of a voltage divider is coupled to an output terminal O8 of the MF pre-amplifier 804 and an output terminal of the voltage divider is coupled to an input terminal I6 of the MF pre-amplifier 804.

It should be noted that when the MF oscillator 803 is used with the HF oscillator 506A and the LF oscillator 506B to oscillate at the medium frequency, the HF oscillator 506A oscillates at the high frequency, which ranges from 20 MHz to 100 MHz instead of from 10 MHz to 100 MHz. For example, a range of frequency of oscillation of the MF oscillator 803 is exclusive of a range of frequency of oscillation of the HF oscillator 506A. Also, a range of frequency of oscillation of the HF oscillator 506A is exclusive of a range of frequency of oscillation of the LF oscillator 506B and the range of frequency of oscillation of the LF oscillator 506B is exclusive of the range of oscillation of the MF oscillator 803.

An example of the gain setting 808 includes a motor and a connection, and the motor is coupled to the feedback gain control 806 via the connection. As an example, a combination of the gain setting 808 and the feedback gain control 806 is a variable voltage supply.

Examples of the MF pre-amplifier 804 include an operational amplifier, a fixed amplifier, and an amplifier whose gain is controlled by a voltage. When the MF pre-amplifier 804 is an operational amplifier, a positive input terminal, such as the input terminal I6, of the operational amplifier is coupled to an output terminal O7 of the MF oscillator 803 and a negative input terminal of the operational amplifier is coupled to the ground potential. Examples of the combiner 814 include a modulator and a multiplier. The combiner 814 can be implemented as an ASIC, or a PLD, or a multiplier circuit, or a controller, or a processor.

The output terminal O7 of the MF oscillator 803 is coupled to the input terminal I6 of the MF pre-amplifier 804, the output terminal O4 of the LF pre-amplifier 510B is coupled to the input terminal I4 of the combiner 914, and the output terminal O3 of the HF pre-amplifier 510A is coupled to the input terminal I3 of the combiner 914. Moreover, an output terminal O8 of the MF oscillator 803 is coupled to an input terminal I7 of the combiner 814. Also, the output terminal O5 of the combiner 814 is coupled to the other end of the feedback gain control 536. Moreover, the output terminal O8 of the MF pre-amplifier 804 is coupled to one end of the feedback gain control 806 and another end of the feedback gain control 806 is coupled to the input terminal I6 of the MF pre-amplifier 804 and to the output terminal O7 of the MF oscillator 803.

The MF oscillator 803 oscillates to generate a medium RF signal 822. The medium RF signal 822 has the medium frequency, which is between the high frequency of the high frequency RF signal 508A and the low frequency of the low frequency RF signal 508B. For example, the medium RF signal 822 has a frequency of 13.56 MHz, the low frequency RF signal 508A has a frequency of 2 MHz and the high frequency RF signal 508B has a frequency of 60 MHz. As another example, the medium RF signal 822 has a frequency of 27 MHz, the low frequency RF signal 508A has a frequency of 400 kHz and the high frequency RF signal 508B has a frequency of 60 MHz. As another example, the medium frequency is less than the high frequency of the high frequency RF signal 508A and is greater than the low frequency of the low frequency RF signal 508B.

The medium RF signal 822 is supplied from the output terminal O7 of the MF oscillator 803 to the input terminal I6 of the MF pre-amplifier 804 via a conductor that couples the output terminal O7 to the input terminal I6. The MF pre-amplifier 804 amplifies a variable of the medium RF signal 822 according to a gain value "c" to output a variable of an amplified medium RF signal 824 at the output terminal O8 of the MF pre-amplifier 804. The variable of amplified medium RF signal 824 is amplified by the gain value "c" with respect to the variable of the medium RF signal 822. The gain value "c" is controlled by a parameter, such as a resistance or voltage, of the feedback gain control 806. The parameter of the feedback gain control 806 is controlled by the gain setting 808, which is coupled to the probe control and system control 110 of FIG. 1. For example, the processor of the probe control and system control 110 sends a control signal to the motor of the gain setting 808 to rotate a rotor of the motor with respect to a stator of the motor. Once the motor rotates, a length of the resistor of the feedback gain control 806 changes to change a resistance of the resistor. The change in the resistance of the resistor changes the gain value "c" to control a gain provided by the MF pre-amplifier 804. As another example, the processor of the probe control and system control 110 sends a control signal to a variable voltage supply, which is an example of the combination of the gain setting 808 and the feedback gain control 806, to change an amount of voltage of the variable voltage supply. The change in the amount of voltage of the variable voltage supply changes a voltage at the input terminal I6 of the MF pre-amplifier 804 to change the gain value "c" of the MF pre-amplifier 804.

The combiner 814 receives at its input terminal I7 the amplified medium RF signal 824 from the output terminal O8 of the MF pre-amplifier 804 via a conductor, which couples the output terminal O8 to the input terminal I7 of the combiner 814. Moreover, the combiner 814 receives the amplified low frequency RF signal 512B and the amplified high frequency RF signal 512A. The combiner 814 combines, such as modulates or multiplies, the variable of the amplified high frequency RF signal 512A with the variable of the amplified low frequency RF signal 512B and the variable of the amplified medium RF signal 824 to generate a variable of a combined RF signal 816. For example, the combiner 814 multiplies power of the amplified high frequency RF signal 512A with power of the amplified low frequency RF signal 512B and power of the amplified medium RF signal 824 to generate the combined RF signal 816 having a product of the powers of the amplified high frequency RF signal 512A, the amplified low frequency RF signal 512B, and the amplified medium RF signal 824. As another example, the combiner 814 multiplies voltage of the amplified high frequency RF signal 512A with voltage of the amplified low frequency RF signal 512B and voltage of the amplified medium RF signal 824 to generate the combined RF signal 816 having a product of the voltages of the amplified high frequency RF signal 512A, the amplified low frequency RF signal 512B, and the amplified medium RF signal 824.

The combined RF signal 816 is supplied from the output terminal O5 of the combiner 516 to the input terminal I5 of the HF power amplifier 518 via a conductor that couples the output terminal O5 to the input terminal I5. The HF power amplifier 518 amplifies the variable of the combined RF signal 816 according to the gain value "Z" to output a variable of an RF signal 810 at the output terminal O6. The RF signal 810 is an amplified RF signal, which is amplified by the gain value "Z" with respect to the combined RF signal 816. The gain value "Z" provided by the RF signal 810 is controlled, such as changed, in the same manner, described above, in which the gain value "Z" provided by the RF signal 403 is controlled. The RF signal 810 is sent from the output terminal O6 of the HF power amplifier 518 via the RF cable 105 to an input terminal of an HF match 811.

The HF match 811 receives the RF signal 810 and matches an impedance of the load coupled to the output terminal of the HF match 811 with an impedance of a source coupled to the input terminal of the HF match 811 to output a modified RF signal 812. The RF signal 810 is an example of the RF signal 111 of FIG. 1 and the modified RF signal 812 is an example of the modified RF signal 113 of FIG. 1. An example of the source coupled to the input terminal of the HF match 811 includes the HF generator 802 and the RF cable 105. The distributor 121 receives the modified RF signal 812 from the output terminal of the HF match 811 via the RF transmission line 107 and distributes RF power of the modified RF signal 812 into a plurality of RF signals, each of which is sent to a corresponding one of the stations 1 through 4.

Figure 9:
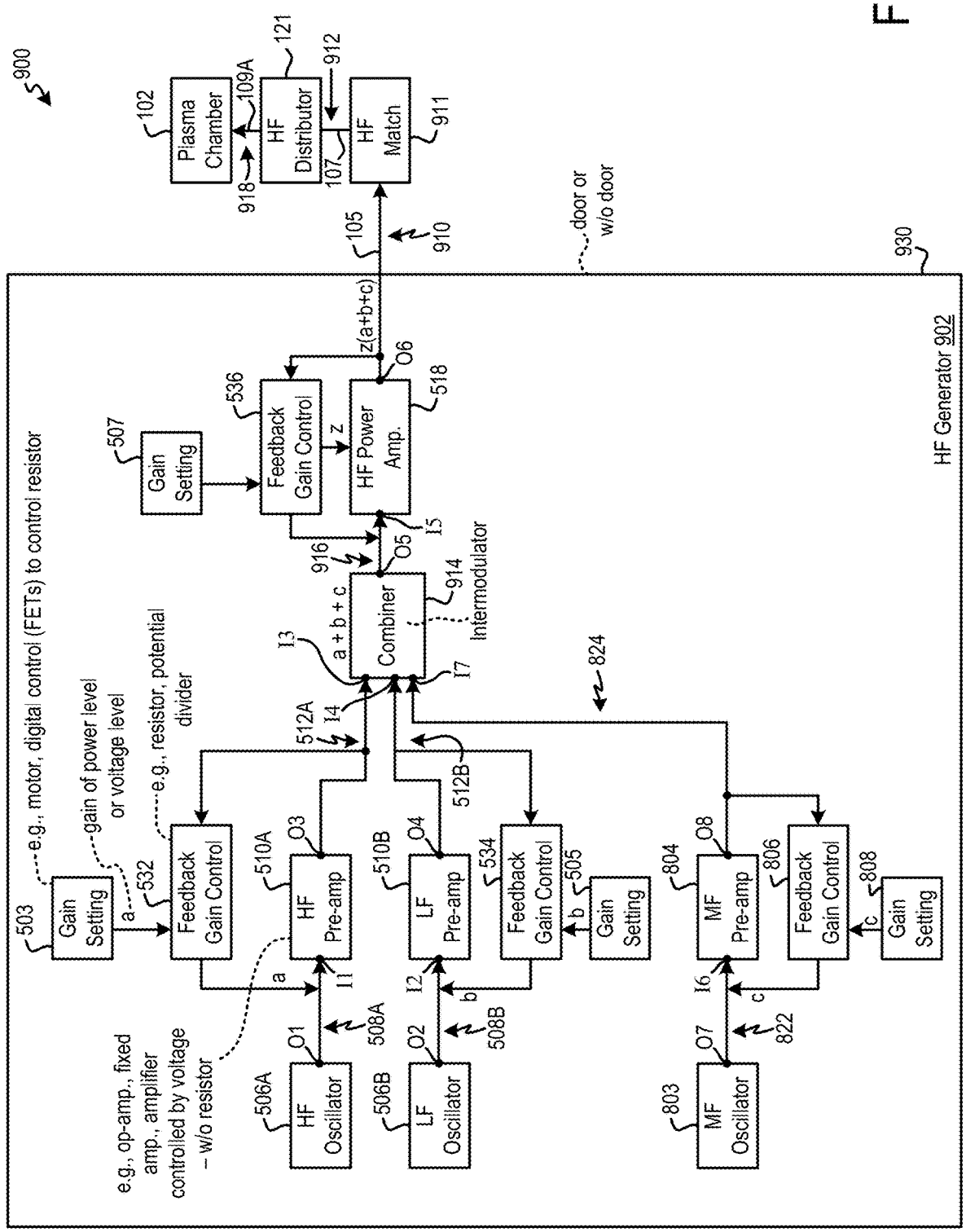
FIG. 9 is a diagram of an embodiment of a system to illustrate an embodiment of an HF generator in which variables associated with three frequencies are inter-modulated.

FIG. 9 is a diagram of an embodiment of a system 900 to illustrate an embodiment of an HF generator 902. The system 900 includes the HF generator 902, an HF match 911, the HF distributor 121, and the plasma chamber 102. The HF generator 902 is an example of the RF generator 104 of FIG. 1 and the HF match 911 is an example of the match network 106 of FIG. 1.

The HF generator 902 includes the same components as that of the HF generator 802 of FIG. 8 except that the HF generator 902 excludes the combiner 814. Instead, the HF generator 902 includes another component, which is a combiner 914. The HF generator 902 has a housing 930, which is made from a metal. The housing 930 of the HF generator 902 encloses the components of the HF generator 902. As an example, the housing 930 has a width of 17.1 inches, a depth of 19.7 inches, and a height of 7 inches. As another example, the housing 930 has a width of 16 inches, a depth of 15 inches, and a height of 5 inches. It should be noted that a height of the housing 930 can be 3U, 5U, or 7U. For example, the HF generator 902 can be provided as a 3U rack unit or a 5U rack unit or a 7U rack unit. The housing 930 is supported by a rack.

The components of the housing 930 of the HF generator 902 are accessible via a door of the housing or via a side of the housing 930. For example, the user opens the door of the housing 930 of the HF generator 902 to gain access to one or more of the components of the housing 930. As another example, the user removes a side wall or a top wall of the housing 930 of the HF generator 902 to access one or more of the components of the housing 930.

Examples of the combiner 914 include an intermodulator and an adder. The combiner 914 can be implemented as an ASIC, or a PLD, or an adder circuit, or a controller, or a processor.

The output terminal O8 of the MF pre-amplifier 804 is coupled to the input terminal I7 of the combiner 914, the output terminal O4 of the LF pre-amplifier 510B is coupled to the input terminal I4 of the combiner 914, and the output terminal O3 of the HF pre-amplifier 510A is coupled to the input terminal I3 of the combiner 914. The output terminal O5 of the combiner 914 is coupled to the input terminal I5 of the HF power amplifier 518. Also, the other end of the feedback gain control 536 is coupled to the output terminal O5 of the combiner 914.

The combiner 914 receives at its input terminal I7, the amplified medium RF signal 824 from the output terminal O8 of the MF pre-amplifier 804 via a conductor that couples the output terminal O8 to the input terminal I7. Moreover, the combiner 914 receives its input terminal I3 the amplified high frequency RF signal 512A and receives at its input terminal I4 the amplified low frequency RF signal 512B. The combiner 704 combines, such as intermodulates or adds, the variable of the amplified high frequency RF signal 512A with the variable of the amplified low frequency RF signal 512B and with the variable of the amplified medium RF signal 824 to generate a variable of a combined RF signal 916. For example, the combiner 914 adds power of the amplified high frequency RF signal 512A and power of the amplified low frequency RF signal 512B and power of the amplified medium RF signal 824 to generate the combined RF signal 916 having a sum or a total of the powers of the amplified high frequency RF signal 512A, the amplified low frequency RF signal 512B, and the amplified medium RF signal 824.

The combined RF signal 916 is supplied from the output terminal O5 of the combiner 914 to the input terminal I5 of the HF power amplifier 518 via a conductor that couples the output terminal O5 to the input terminal I5. The HF power amplifier 518 amplifies the variable of the combined RF signal 916 according to the gain value "Z" to output a variable of an RF signal 910 at the output terminal O6. The RF signal 910 is an amplified RF signal, which is amplified by the gain value "Z" with respect to the combined RF signal 916. The RF signal 910 is sent from the output terminal O6 of the HF power amplifier 518 via the RF cable 105 to the input terminal of the HF match 911.

The HF match 911 receives the RF signal 910 and matches an impedance of the load coupled to the output terminal of the HF match 911 with an impedance of a source coupled to the input terminal of the HF match 911 to output a modified RF signal 912. The RF signal 910 is an example of the RF signal 111 of FIG. 1 and the modified RF signal 912 is an example of the modified RF signal 113 of FIG. 1. An example of the source coupled to the input terminal of the HF match 911 includes the HF generator 902 and the RF cable 105. The distributor 121 receives the modified RF signal 912 from the output terminal of the HF match 911 via the RF transmission line 107 and distributes RF power of the modified RF signal 912 into a plurality of RF signals, each of which is sent to a corresponding one of the stations 1 through 4.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:
1. A radio frequency (RF) generator comprising:
a first oscillator configured to generate a first RF signal;
a second oscillator configured to generate a second RF signal;
a first circuit coupled to the first oscillator to receive the first RF signal, wherein the first circuit is configured to apply a gain to the first RF signal;
a first feedback gain controller coupled to first circuit and to the first oscillator, wherein the first feedback gain controller is configured to control an amount of the gain applied to the first RF signal to output a first adjusted RF signal;
a second circuit coupled to the second oscillator to receive the second RF signal, wherein the second circuit is configured to apply a gain to the second RF;
a second feedback gain controller coupled to the second circuit and to the second oscillator, wherein the second feedback gain controller is configured to control an amount of the gain applied to the second RF signal to output a second adjusted RF signal; and
a combiner coupled to the first circuit to receive the first adjusted RF signal from the first circuit, wherein the combiner is coupled to the second circuit to receive the second adjusted RF signal from the second circuit, wherein the combiner is configured to multiply the first adjusted RF signal with the second adjusted RF signal to output a combined RF signal.

2. The RF generator of claim 1, wherein the combiner is configured to multiply a voltage of the first adjusted RF signal with a voltage of the second adjusted RF signal to output the combined RF signal, wherein the combined RF signal has an envelope having a frequency of the first RF signal, wherein the combined RF signal has a frequency of the second RF signal.

3. The RF generator of claim 1, further comprising a housing including the first oscillator, the second oscillator, the first circuit, the second circuit, and the combiner.

4. The RF generator of claim 1, further comprising a third circuit coupled to the combiner, wherein the third circuit is configured to apply a gain to the combined RF signal to output a gain-adjusted RF signal.

5. The RF generator of claim 1, wherein the first circuit is a first pre-amplifier circuit and the second circuit is a second pre-amplifier circuit, wherein the first pre-amplifier circuit is configured to amplify the first RF signal to output the first adjusted RF signal, wherein the second pre-amplifier circuit is configured to amplify the second RF signal to output the second adjusted RF signal.

6. A radio frequency generator comprising:
a first oscillator configured to generate a first RF signal;
a second oscillator configured to generate a second RF signal;
a first circuit coupled to the first oscillator to receive the first RF signal, wherein the first circuit is configured to apply a gain to the first RF signal to output a first adjusted RF signal;
a second circuit coupled to the second oscillator to receive the second RF signal, wherein the second circuit is configured to apply a gain to the second RF signal to output a second adjusted RF signal;
a combiner coupled to the first circuit to receive the first adjusted RF signal from the first circuit, wherein the combiner is coupled to the second circuit to receive the second adjusted RF signal from the second circuit, wherein the combiner is configured to multiply the first adjusted RF signal with the second adjusted RF signal to output a combined RF signal;
a third circuit coupled to the combiner, wherein the third circuit is configured to apply a gain to the combined RF signal to output a gain-adjusted RF signal; and a feedback gain controller coupled to the third circuit and to the combiner, wherein the feedback gain controller is configured to control an amount of the gain applied to the combined RF signal.

7. A radio frequency (RF) generator comprising:
a first oscillator configured to generate a first RF signal;
a second oscillator configured to generate a second RF signal;
a first circuit coupled to the first oscillator to receive the first RF signal, wherein the first circuit is configured to apply a gain to the first RF signal;
a first feedback gain controller coupled to first circuit and to the first oscillator, wherein the first feedback gain controller is configured to control an amount of the gain applied to the first RF signal to output a first adjusted RF signal;
a second circuit coupled to the second oscillator to receive the second RF signal, wherein the second circuit is configured to apply a gain to the second RF signal;
a second feedback gain controller coupled to the second circuit and to the second oscillator, wherein the second feedback gain controller is configured to control an amount of the gain applied to the second RF signal to output a second adjusted RF signal; and
a combiner coupled to the first circuit to receive the first adjusted RF signal from the first circuit, wherein the combiner is coupled to the second circuit to receive the second adjusted RF signal from the second circuit, wherein the combiner is configured to add the first adjusted RF signal with the second adjusted RF signal to output a combined RF signal.

8. The RF generator of claim 7, wherein the combiner is configured to add a voltage of the first adjusted RF signal with a voltage of the second adjusted RF signal to output the combined RF signal, wherein the combined RF signal has an envelope having a frequency of the first RF signal, wherein the combined RF signal has a frequency of the second RF signal.

9. The RF generator of claim 7, further comprising a housing including the first oscillator, the second oscillator, the first circuit, the second circuit, and the combiner.

10. The RF generator of claim 7, further comprising a third circuit coupled to the combiner, wherein the third circuit is configured to apply a gain to the combined RF signal to output a gain-adjusted RF signal.

11. The RF generator of claim 7, wherein the first circuit is a first pre-amplifier circuit and the second circuit is a second pre-amplifier circuit, wherein the first pre-amplifier circuit is configured to amplify the first RF signal to output the first adjusted RF signal, wherein the second pre-amplifier circuit is configured to amplify the second RF signal to output the second adjusted RF signal.

12. A radio frequency generator comprising:
a first oscillator configured to generate a first RF signal;
a second oscillator configured to generate a second RF signal;
a first circuit coupled to the first oscillator to receive the first RF signal, wherein the first circuit is configured to apply a gain to the first RF signal to output a first adjusted RF signal;
a second circuit coupled to the second oscillator to receive the second RF signal, wherein the second circuit is configured to apply a gain to the second RF signal to output a second adjusted RF signal;
a combiner coupled to the first circuit to receive the first adjusted RF signal from the first circuit, wherein the combiner is coupled to the second circuit to receive the second adjusted RF signal from the second circuit, wherein the combiner is configured to add the first adjusted RF signal with the second adjusted RF signal to output a combined RF signal
a third circuit coupled to the combiner, wherein the third circuit is configured to apply a gain to the combined RF signal to output a gain-adjusted RF signal; and
a feedback gain controller coupled to the third circuit and to the combiner, wherein the feedback gain controller is configured to control an amount of the gain applied to the combined RF signal.

13. A method comprising:
generating a first radio frequency (RF) signal;
generating a second RF signal;
applying a gain to the first RF signal and controlling an amount of the gain applied to the first RF signal to output a first adjusted RF signal;
applying a gain to the second RF signal and controlling an amount of the gain applied to the second RF signal to output a second adjusted RF signal; and
multiplying the first adjusted RF signal with the second adjusted RF signal to output a combined RF signal.

14. The method of claim 13, wherein said multiplying comprises multiplying a voltage of the first adjusted RF signal with a voltage of the second adjusted RF signal to output the combined RF signal, wherein the combined RF signal has an envelope having a frequency of the first RF signal, wherein the combined RF signal has a frequency of the second RF signal.

15. The method of claim 13, further comprising applying a gain to the combined RF signal to output a gain-adjusted RF signal.

16. A method comprising:
generating a first RF signal;
generating a second RF signal;
applying a gain to the first RF signal and controlling an amount of the gain applied to the first RF signal to output a first adjusted RF signal;
applying a gain to the second RF signal and controlling an amount of the gain applied to the second RF signal to output a second adjusted RF signal;
adding the first adjusted RF signal with the second adjusted RF signal to output a combined RF signal.

17. The method of claim 16, wherein said adding comprises adding a voltage of the first adjusted RF signal with a voltage of the second adjusted RF signal to output the combined RF signal, wherein the combined RF signal has an envelope having a frequency of the first RF signal, wherein the combined RF signal has a frequency of the second RF signal.

18. The method of claim 16, further comprising applying a gain to the combined RF signal to output a gain-adjusted RF signal.

* * * * *